(12) United States Patent
An et al.

(10) Patent No.: US 12,185,592 B2
(45) Date of Patent: Dec. 31, 2024

(54) DISPLAY MODULE, AND ELECTRONIC DEVICE INCLUDING THE SAME

(71) Applicant: SAMSUNG DISPLAY CO., LTD., Yongin-si (KR)

(72) Inventors: Chiwook An, Hwaseong-si (KR); Wangwoo Lee, Osan-si (KR); Jiseon Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 388 days.

(21) Appl. No.: 17/653,862

(22) Filed: Mar. 7, 2022

(65) Prior Publication Data

US 2022/0384544 A1 Dec. 1, 2022

(30) Foreign Application Priority Data

May 25, 2021 (KR) .................. 10-2021-0067059

(51) Int. Cl.
*H10K 59/122* (2023.01)
*H10K 50/86* (2023.01)
*H01L 27/12* (2006.01)
*H10K 50/813* (2023.01)
*H10K 59/121* (2023.01)
*H10K 59/38* (2023.01)
*H10K 59/88* (2023.01)

(52) U.S. Cl.
CPC .......... *H10K 59/122* (2023.02); *H10K 50/86* (2023.02); *H01L 27/124* (2013.01); *H10K 50/813* (2023.02); *H10K 59/1213* (2023.02); *H10K 59/38* (2023.02); *H10K 59/88* (2023.02)

(58) Field of Classification Search
CPC .... H10K 59/122; H10K 50/86; H10K 50/813; H10K 59/1213; H10K 59/38; H10K 59/88; H10K 59/80515; H10K 59/8791; H10K 59/353; H10K 59/35; H10K 59/121; H10K 59/131; H01L 27/124
See application file for complete search history.

(56) References Cited

U.S. PATENT DOCUMENTS

| 10,978,677 | B2 * | 4/2021 | Kim ..................... H10K 59/122 |
| 11,081,532 | B2 | 8/2021 | Lee et al. |
| 2008/0316410 | A1 * | 12/2008 | Fujii .................. H10K 59/8052 349/139 |
| 2019/0189706 | A1 | 6/2019 | Choi |

(Continued)

FOREIGN PATENT DOCUMENTS

| CN | 110189639 | 8/2019 |
| CN | 110289298 | 9/2019 |

(Continued)

*Primary Examiner* — Kevin Quarterman
(74) *Attorney, Agent, or Firm* — F. CHAU & ASSOCIATES, LLC

(57) ABSTRACT

An electronic device includes a display panel having a first area, a second area, and a third area. The display panel includes a first pixel including a first light emitting element disposed in the first area and a first pixel circuit disposed ion the second area and configured to drive the first light emitting element. A second pixel is disposed in the second area. A third pixel disposed in the third area. A pixel defining pattern is disposed on the first pixel electrode and has a ring shape when viewed in a plane (e.g., in a plan view).

24 Claims, 26 Drawing Sheets

(56) References Cited

U.S. PATENT DOCUMENTS

| | | | |
|---|---|---|---|
| 2019/0245017 | A1 | 8/2019 | Jeon et al. |
| 2020/0152919 | A1* | 5/2020 | Joo ....................... H10K 59/38 |
| 2020/0373372 | A1 | 11/2020 | Chung et al. |
| 2021/0327958 | A1 | 10/2021 | Li et al. |
| 2022/0102466 | A1 | 3/2022 | Qiu et al. |

FOREIGN PATENT DOCUMENTS

| | | |
|---|---|---|
| CN | 110444125 | 11/2019 |
| CN | 110890412 | 3/2020 |
| CN | 112151686 | 12/2020 |
| KR | 10-2020-0083745 | 7/2020 |

\* cited by examiner

DISPLAY MODULE, AND ELECTRONIC DEVICE INCLUDING THE SAME

CROSS-REFERENCE TO RELATED APPLICATION

This U.S. non-provisional patent application claims priority under 35 U.S.C. § 119 to Korean Patent Application No. 10-2021-0067059, filed on May 25, 2021, the entire contents of which are hereby incorporated by reference.

TECHNICAL FIELD

The present disclosure herein relates to a display module and, more particularly, to a display module and an electronic device including the same.

DISCUSSION OF THE RELATED ART

Modern electronic devices often incorporate the use of a display panel and one or more electronic modules disposed therein. These electronic modules may include a camera, an infrared sensor, a proximity sensor, or the like. These electronic modules may be disposed below the display panel so that the functionality of the electronic modules may be achieved without having to enlarge a non-display area of the electronic device to accommodate the electronic modules. Because of the presence of these electronic modules, the transmittance of light of a first partial area of the display panel may be higher than that of a second partial area of the display panel so as to better allow light to pass therethrough on its way to or from the electronic modules.

SUMMARY

An electronic device includes a display panel having a first area, a second area adjacent to the first area, and a third area surrounding at least a portion of the second area. The display panel includes a first pixel including a first light emitting element disposed in the first area and a first pixel circuit disposed in the second area and configured to drive the first light emitting element. The first light emitting element includes a first pixel electrode. A second pixel includes a second light emitting element disposed in the second area and a second pixel circuit, disposed in the second area, configured to drive the second light emitting element. The second light emitting element includes a second pixel electrode. A third pixel includes a third light emitting element disposed in the third area and a third pixel circuit, disposed in the third area, configured to drive the third light emitting element. The third light emitting element includes a third pixel electrode. A pixel defining pattern disposed on the first pixel electrode has a ring shape.

The display panel may further include a pixel defining film covering the second pixel electrode and the third pixel electrode. The pixel defining film may include a first opening exposing a portion of the second pixel electrode and a second opening exposing a portion of the third pixel electrode. The pixel defining film may include a same material as the pixel defining pattern.

The electronic device may further include an anti-reflection layer disposed on the display panel and including a first color filter overlapping the first pixel electrode, a second color filter overlapping the second pixel electrode, and a third color filter overlapping the third pixel electrode.

An edge of the first color filter may overlap the pixel defining pattern.

The pixel defining pattern may include a first edge overlapping the first pixel electrode and a second edge surrounding the first edge. A distance between the edge of the first color filter and the first edge may be longer than a distance between the edge of the first color filter and the second edge.

Each of an edge of the first pixel electrode and the first and second edges of the pixel defining pattern may be curved.

The anti-reflection layer may further include a division layer overlapping the second and third areas and not overlapping the first area. A plurality of openings may be defined in the division layer. The second color filter may cover any one of the plurality of openings, and the third color filter may cover another one of the plurality of openings.

The anti-reflection layer may further include a division pattern overlapping the first area. The division pattern may have a ring shape including a first division edge and a second division edge surrounding the first division edge, and the first color filter may cover an area surrounded by the first division edge.

The pixel defining pattern may include a first edge overlapping the first pixel electrode and a second edge surrounding the first edge. A distance between the first edge and the second edge may be longer than a distance between the first division edge and the second division edge.

The display panel may further include a common electrode included in each of the first light emitting element, the second light emitting element, and the third light emitting element. A plurality of electrode openings may be defined in a portion of the common electrode disposed in the first area.

The anti-reflection layer may further include a connection pattern overlapping the first area and the common electrode and the connection pattern may be spaced apart from the plurality of electrode openings.

The anti-reflection layer may further include a dummy color filter overlapping the second area.

The display panel may further include a dummy pixel electrode disposed in the second area and overlapping the dummy color filter.

The dummy pixel electrode and the dummy color filter may each overlap the first pixel circuit.

The display panel may further include a connection line electrically connecting the first light emitting element and the first pixel circuit to each other. The connection line may include a light-transmissive material.

The first area may include a transmissive area and an element area. The first pixel electrode may overlap the element area, and at least a portion of the connection line may overlap the transmissive area.

The electronic device may further include an electronic module disposed below the first area.

A surface area of the first pixel electrode may be larger than a surface area of the third pixel electrode.

The first light emitting element may be provided in plural, and the third light emitting element may be provided in plural. A distance between two first light emitting elements closest to each other among the plurality of first light emitting elements may be longer than a distance between two third light emitting elements closest to each other among the plurality of third light emitting elements.

The first light emitting element may be provided in plural, and the pixel defining pattern may be provided in plural. The plurality of pixel defining patterns may correspond one-to-one to the plurality of first light emitting elements and may partially overlap the plurality of first light emitting elements. The plurality of pixel defining patterns may be spaced apart from each other.

A display module includes a display panel including a first area and a second area adjacent to the first area. The display module further includes a base layer, a circuit layer disposed on the base layer, a first pixel electrode disposed on the circuit layer and disposed in the first area, and a pixel defining pattern disposed on the circuit layer and having a ring shape covering an edge of the first pixel electrode. An anti-reflection layer is disposed on the display panel and includes a first color filter overlapping the first pixel electrode. The pixel defining pattern includes a first edge overlapping the first pixel electrode and a second edge surrounding the first edge. A distance between an edge of the first color filter and the first edge is longer than a distance between the edge of the first color filter and the second edge.

The anti-reflection layer may further include a division pattern overlapping the first area. The division pattern may have a ring shape including a first division edge and a second division edge surrounding the first division edge. The first color filter may cover an area surrounded by the first division edge, and a distance between the first edge and the second edge may be longer than a distance between the first division edge and the second division edge.

The display panel may further include a second pixel electrode disposed on the circuit layer and disposed in the second area, and a pixel defining film disposed on the circuit layer and covering the second pixel electrode. The pixel defining film may include an opening exposing a portion of the second pixel electrode, and the anti-reflection layer may further include a second color filter overlapping the second pixel electrode and a dummy color filter overlapping the second area.

A display module includes a base layer. A circuit layer is disposed on the base layer and includes a pixel circuit and a connection line connected to the pixel circuit and including a light-transmissive material. A pixel electrode is disposed on the circuit layer and is electrically connected to the connection line. A pixel defining pattern is disposed on the circuit layer, covers an edge of the pixel electrode, and includes a first edge overlapping the pixel electrode and a second edge surrounding the first edge. Each of the edge of the pixel electrode and the first and second edges of the pixel defining pattern are curved.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to describe principles of the inventive concept. In the drawings.

DETAILED DESCRIPTION

Figure 1:
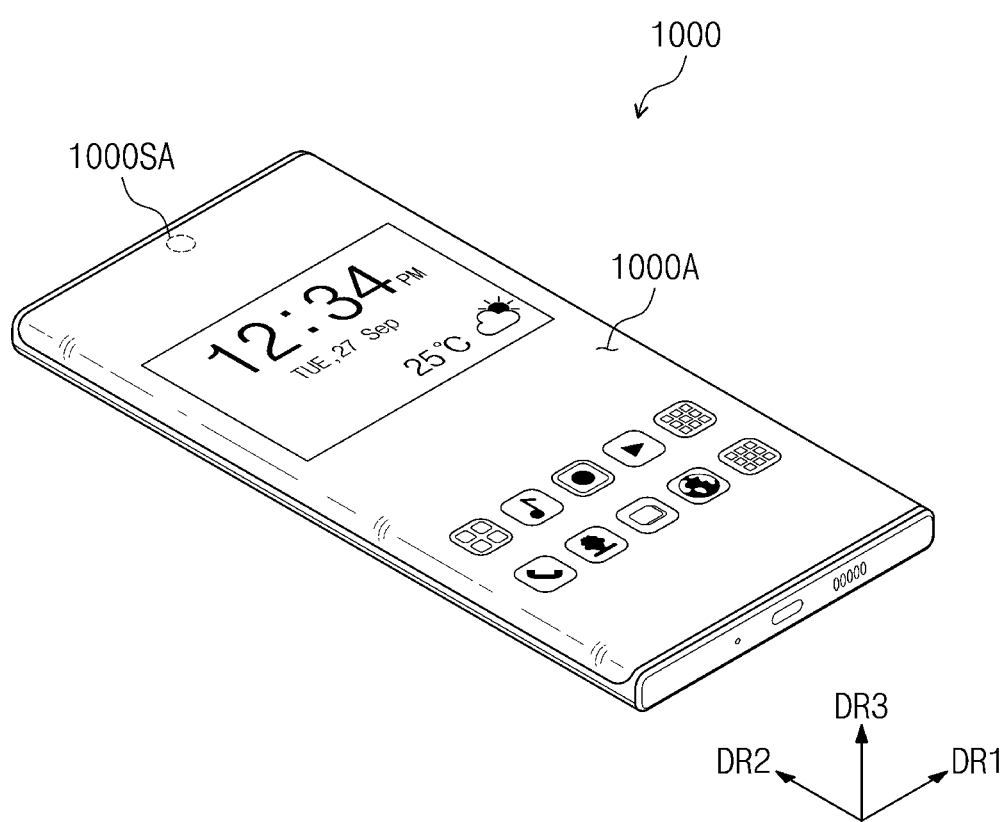
FIG. 1 is a perspective view of an electronic device according to an embodiment of the inventive concept.

In describing embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

It will be understood that when an element or layer (e.g., region, portion, and the like) is referred to as being "on", "connected to", or "coupled to" another element or layer, it can be directly on, connected to, or coupled to the other element or layer, or intervening elements or layers may be present.

Like reference numerals may refer to like elements throughout this specification. In the figures, the thicknesses, ratios, and dimensions of elements may be exaggerated for effective description of the technical contents. However, it is to be understood that the relative thicknesses, ratios, and angles shown do in fact represent at least some embodiments of the present disclosure. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not necessarily be limited by these terms. These terms may be used to distinguish one element, component, region, layer, or section from another element, component, region, layer, or section. Thus, a first element, component, region, layer, or section discussed below could be termed a second element, component, region, layer, or section without departing from the teachings of the present invention. As used herein, the singular forms, "a", "an", and "the" are intended to include the plural forms as well, unless the context clearly indicates otherwise.

Spatially relative terms, such as "beneath", "below", "lower", "above", and "upper" may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

It will be further understood that the terms "include" or "have", when used in this specification, specify the presence of stated features, integers, steps, operations, elements, components, and/or groups thereof, but do not preclude the presence or addition of one or more other features, integers, steps, operations, elements, components, and/or groups thereof.

Hereinafter, the present invention will be explained in detail with reference to the accompanying drawings.

FIG. 1 is a perspective view of an electronic device according to an embodiment of the inventive concept.

Referring to FIG. 1, an electronic device 1000 may be a device that is activated according to an electrical signal. For example, the electronic device 1000 may be a mobile phone, a tablet computer, a computer monitor, a television, a car navigation device, a game console, or a wearable device, but the present invention is not necessarily limited thereto. FIG. 1 exemplarily illustrates the electronic device 1000 as a mobile phone.

The electronic device 1000 may display an image through a display area 1000A. The display area 1000A may include a plane defined by a first direction DR1 and a second direction DR2. The display area 1000A may further include curved surfaces respectively bent from at least two sides of the plane. However, the shape of the display area 1000A is not necessarily limited thereto. For example, the display area 1000A may include only the plane (e.g., without curved surfaces) or may further include four curved surfaces respectively bent from at least two sides, e.g., four sides of the plane.

A sensing area 1000SA may be defined in the display area 1000A of the electronic device 1000. Although one sensing area 1000SA is exemplarily illustrated in FIG. 1, the number of sensing areas 1000SA is not necessarily limited thereto. The sensing area 1000SA may be a portion of the display area 1000A. Accordingly, the electronic device 1000 may display an image through the sensing area 1000SA.

An electronic module may be disposed in an area overlapping the sensing area 1000SA (e.g., behind the sensing area 1000SA). The electronic module may receive an external input transmitted through the sensing area 1000SA or may provide an output through the sensing area 1000SA. For example, the electronic module may be a camera module, a sensor that measures distance, such as a proximity sensor, a sensor that senses a part of a user's body (e.g., a fingerprint, an iris, or a face), or a small lamp that outputs light, but is not necessarily limited thereto and may be any form of sensor or output device.

A thickness direction of the electronic device 1000 may be parallel to a third direction DR3 crossing the first direction DR1 and the second direction DR2. Accordingly, a front surface (e.g., a top surface) and a rear surface (e.g., a bottom surface) of each of members constituting the electronic device 1000 may be defined on the basis of the third direction DR3.

Figure 2:
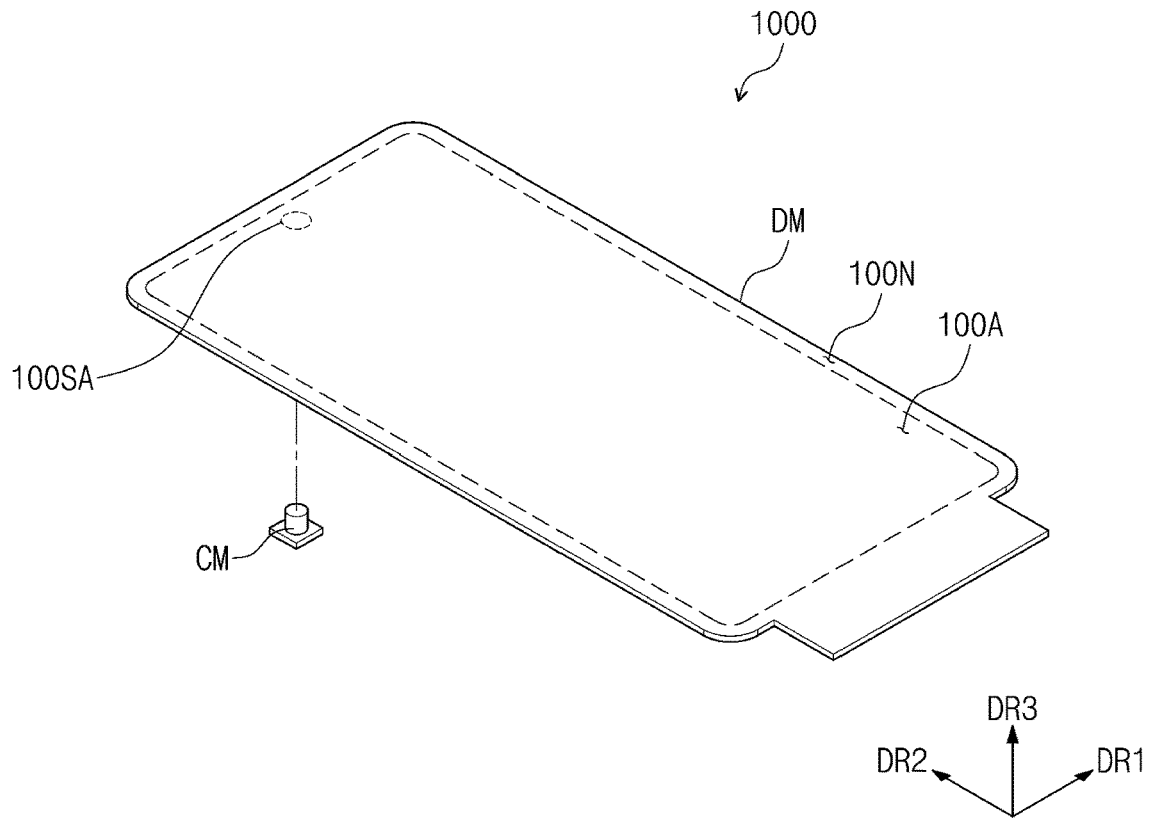
FIG. 2 is an exploded perspective view illustrating components of an electronic device according to an embodiment of the inventive concept.

FIG. 2 is an exploded perspective view illustrating components of an electronic device according to an embodiment of the inventive concept.

Referring to FIG. 2, the electronic device 1000 may include a display module DM and an electronic module CM. The display module DM may be a component that generates an image and senses an input applied from an external source. The electronic module CM may be disposed below the display module DM and may be, for example, a camera module. The display module DM may be referred to as a first electronic module, and the electronic module CM may be referred to as a second electronic module.

A display area 100A and a peripheral area 100N may be defined in the display module DM. The display area 100A may correspond to the display area 1000A illustrated in FIG. 1. A first partial area of the display module DM may have higher transmittance of light than a second partial area, and the first partial area may be defined as a sensing area 100SA. The sensing area 100SA may be a portion of the display area 100A. For example, the sensing area 100SA may display an image and may transmit an external input provided to the electronic module CM and/or an output from the electronic module CM.

Figure 3:
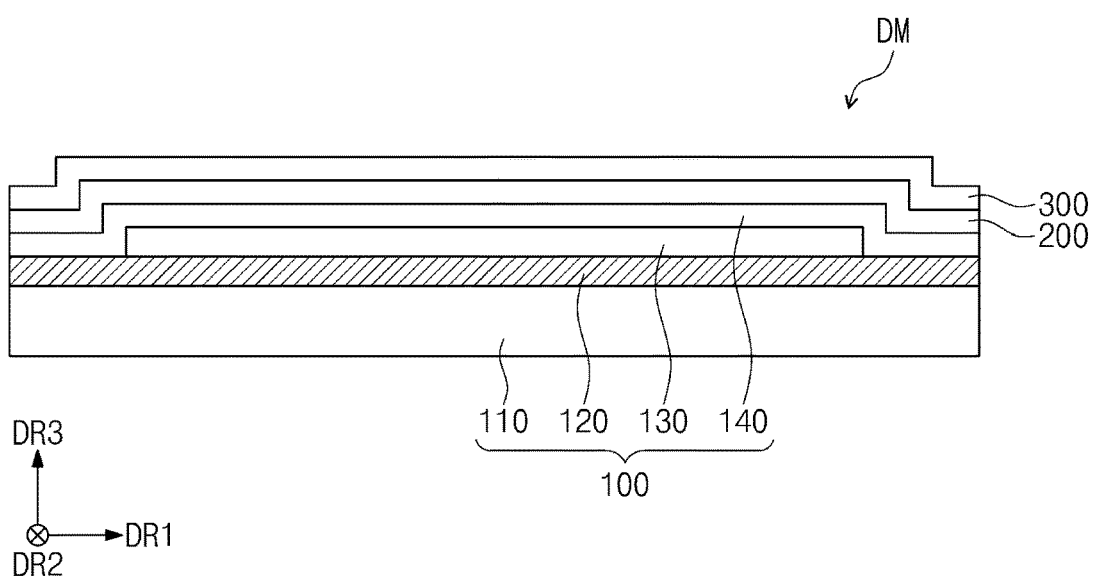
FIG. 3 is a cross-sectional view of a display module according to an embodiment of the inventive concept.

FIG. 3 is a cross-sectional view of a display module according to an embodiment of the inventive concept.

Referring to FIG. 3, the display module DM may include a display panel 100, a sensor layer 200, and an anti-reflection layer 300.

The display panel 100 may be a component that substantially generates an image. The display panel 100 may be a light emitting display panel and may be, for example, an organic light emitting diode (OLED) display panel, an inorganic light emitting diode display panel, a quantum dot display panel, a micro-LED display panel, or a nano-LED display panel. The display panel 100 may be referred to as a display layer.

The display panel 100 may include a base layer 110, a circuit layer 120, a light emitting element layer 130, and an encapsulation layer 140.

The base layer 110 may be a member providing a base surface on which the circuit layer 120 is disposed. The base layer 110 may be a rigid substrate or a flexible substrate capable of being flexed, bent, folded, rolled, stretched, etc. to a non-trivial degree without sustaining damage. The base layer 110 may be a glass substrate, a metal substrate, a polymer substrate, or the like. However, the present invention is not necessarily limited thereto, and the base layer 110 may be an inorganic layer, an organic layer, or a composite material layer.

The base layer 110 may have a multilayer structure. For example, the base layer 110 may include a first synthetic resin layer, an intermediate layer having a multilayer or single-layer structure, and a second synthetic resin layer disposed on the intermediate layer. The intermediate layer may be referred to as a base barrier layer. The intermediate layer may include a silicon oxide ($SiO_x$) layer and an amorphous silicon (a-Si) layer disposed on the silicon oxide layer but the present invention is not necessarily limited thereto. For example, the intermediate layer may include a silicon oxide layer, a silicon nitride layer, a silicon oxynitride layer, and/or an amorphous silicon layer.

Each of the first and second synthetic resin layers may include polyimide-based resin. In addition, each of the first and second synthetic resin layers may include acrylate-based resin, methacrylate-based resin, polyisoprene-based resin, vinyl-based resin, epoxy-based resin, urethane-based resin, cellulose-based resin, siloxane-based resin, polyamide-based resin, and/or perylene-based resin. In this specification, "~~"-based resin means that the "~~"-based resin includes a functional group of "~~".

The circuit layer 120 may be disposed on the base layer 110. The circuit layer 120 may include an insulating layer, a semiconductor pattern, a conductive pattern, a signal line, and the like. The insulating layer, a semiconductor layer, and a conductive layer may be formed on the base layer 110 in a method such as coating and deposition, and thereafter, the insulating layer, the semiconductor layer, and the conductive layer may be selectively patterned through one or more photolithography processes. Thereafter, the semiconductor pattern, the conductive pattern, and the signal line included in the circuit layer 120 may be formed.

The light emitting element layer 130 may be disposed on the circuit layer 120. The light emitting element layer 130 may include a light emitting element. For example, the light emitting element layer 130 may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from foreign matter such as moisture, oxygen, and dust particles.

The sensor layer 200 may be disposed on the display panel 100. The sensor layer 200 may sense an external input applied from an external source. The external input may be a user's input. The user's input may include various types of external inputs such as a part of a user's body, light, heat, a pen, and pressure.

The sensor layer 200 may be formed on the display panel 100 through a continuous process. In this case, the sensor layer 200 may be said to be directly disposed on the display panel 100. The expression "directly disposed" may mean that a third component is not disposed between the sensor layer 200 and the display panel 100. For example, a separate adhesive member might not be disposed between the sensor layer 200 and the display panel 100. Alternatively, the sensor layer 200 may be bonded to display panel 100 by an adhesive member. The adhesive member may include a typical adhesive or a typical detachable adhesive.

The anti-reflection layer 300 may be disposed on the sensor layer 200. The anti-reflection layer 300 may reduce the degree of reflection of external light incident from outside of the display module DM. The anti-reflection layer 300 may be formed on the sensor layer 200 through a continuous process. The anti-reflection layer 300 may include color filters. The color filters may have a predetermined arrangement. For example, the color filters may be arranged in consideration of light emission colors of pixels included in the display panel 100. In addition, the anti-reflection layer 300 may further include a black matrix adjacent to the color filters. A detailed description of the anti-reflection layer 300 will be given later.

In an embodiment of the inventive concept, the sensor layer 200 may be omitted. In this case, the anti-reflection layer 300 may be disposed on the display panel 100. For example, the anti-reflection layer 300 may be directly formed on the display panel 100 through a continuous process.

In an embodiment of the inventive concept, the positions of the sensor layer 200 and the anti-reflection layer 300 may be interchanged. For example, the anti-reflection layer 300 may be disposed between the display panel 100 and the sensor layer 200.

An optical layer disposed on the anti-reflection layer 300 may be further included in the display module DM in an embodiment of the inventive concept. For example, the optical layer may be formed on the anti-reflection layer 300 through a continuous process. The optical layer may control the direction of light incident from the display panel 100 to increase the front luminance of the display module DM. For example, the optical layer may include an organic insulating layer in which openings are defined to respectively correspond to light emitting areas of the pixels included in the display panel 100, and a high refractive index layer which covers the organic insulating layer and fills the openings. The high refractive index layer may have a higher refractive index than the organic insulating layer.

Figure 4:
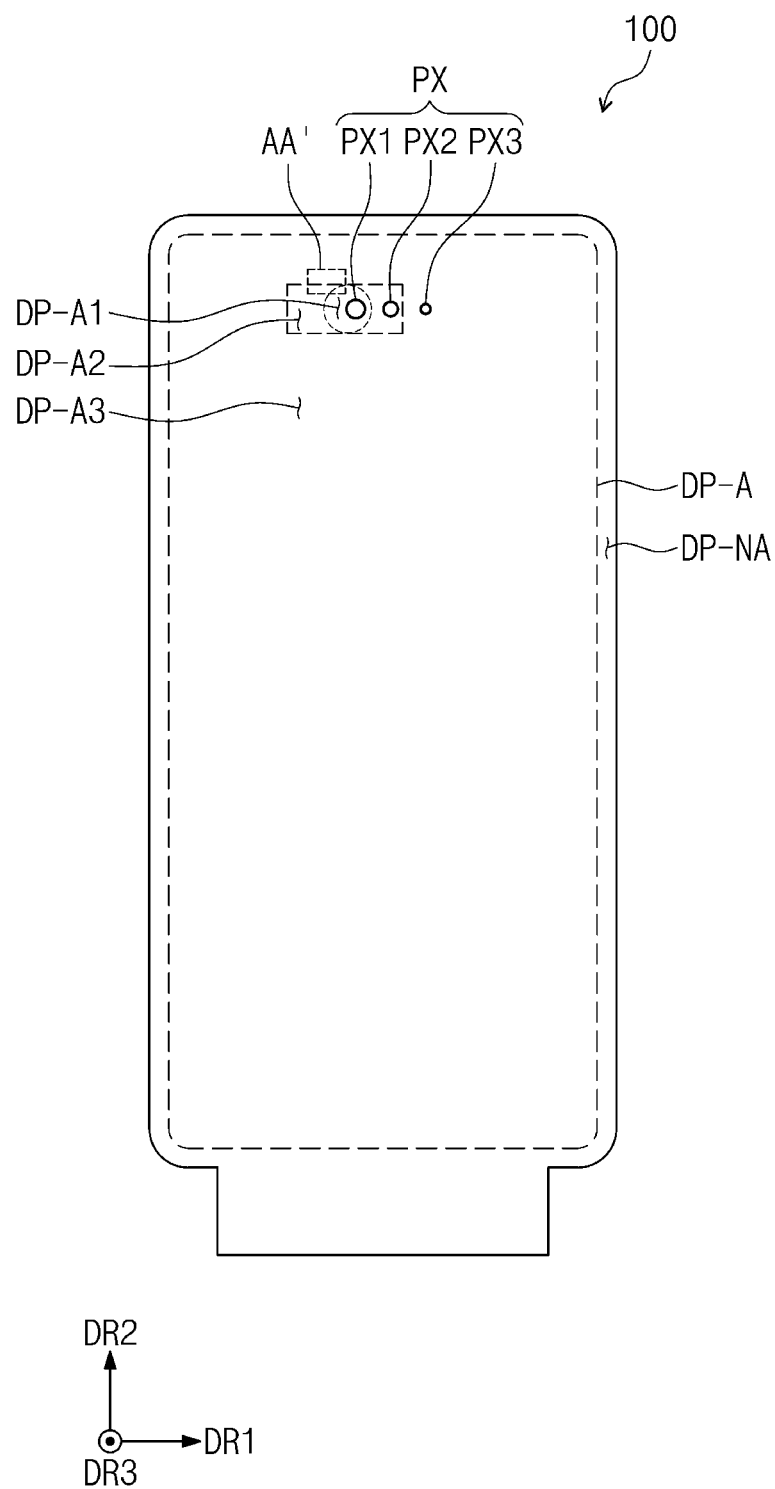
FIG. 4 is a plan view of a display panel according to an embodiment of the inventive concept.
Figure 5:
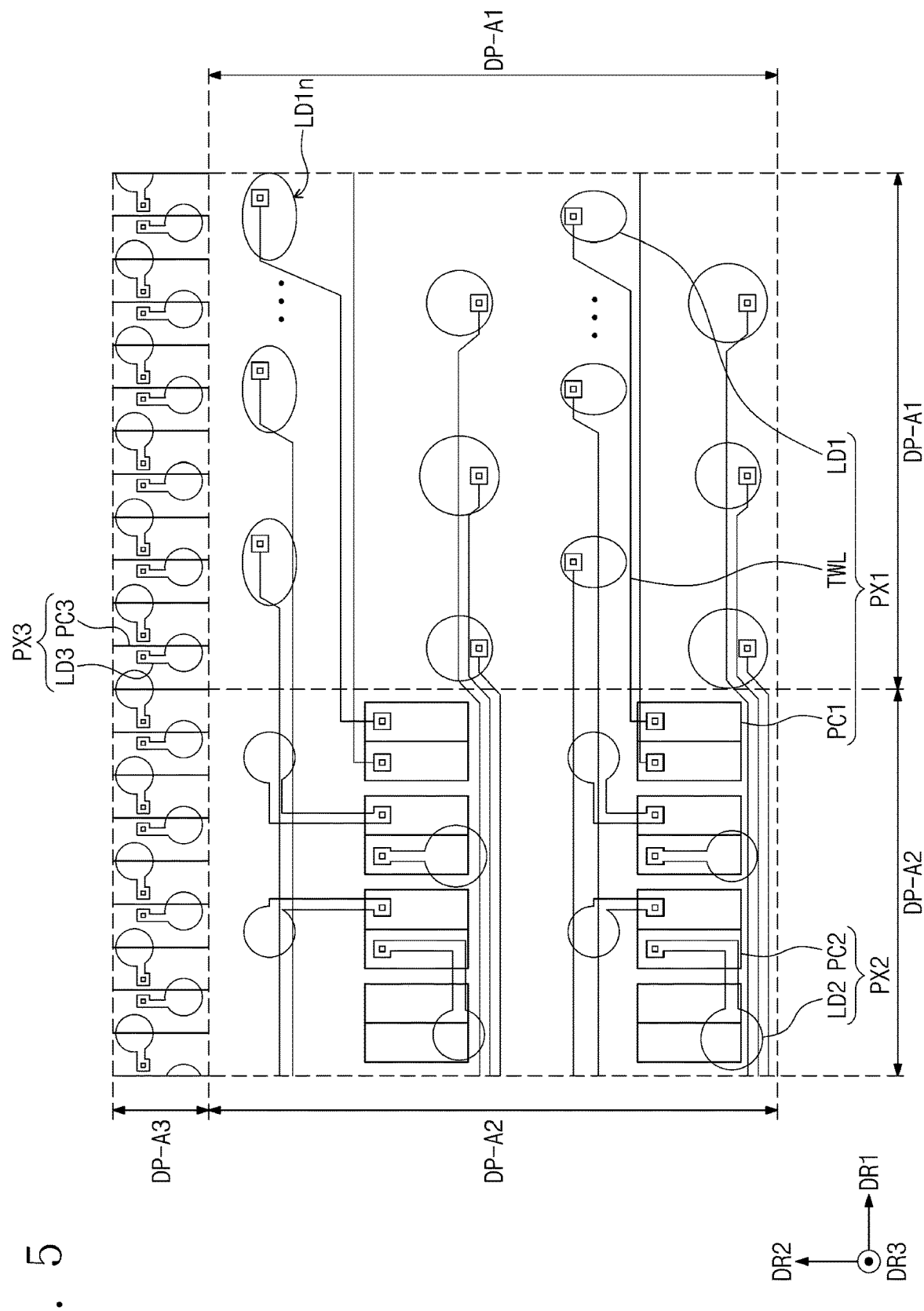
FIG. 5 is an enlarged plan view illustrating the area AA' of FIG. 4.

FIG. 4 is a plan view of a display panel according to an embodiment of the inventive concept. FIG. 5 is an enlarged plan view illustrating the area AA' of FIG. 4.

Referring to FIG. 4 and FIG. 5, the display panel 100 may include a display area DP-A and a peripheral area DP-NA. The peripheral area DP-NA may be adjacent to the display area DP-A and may surround at least a portion of the display area DP-A.

The display area DP-A may include a first area DP-A1, a second area DP-A2, and a third area DP-A3. The first area DP-A1 may be referred to as a component area, the second area DP-A2 may be referred to as an intermediate area or a transition area, and the third area DP-A3 may be referred to as a main display area or a general display area. The first area DP-A1 and the second area DP-A2 may be referred to as an auxiliary display area.

The display panel 100 may include a plurality of pixels PX. The plurality of pixels PX may include a first pixel PX1 emitting light in the first area DP-A1, a second pixel PX2 emitting light in the second area DP-A2, and a third pixel PX3 emitting light in the third area DP-A3.

Each of the first pixel PX1, the second pixel PX2, and the third pixel PX3 may be provided in plural. In this case, each of the first to third pixels PX1, PX2, and PX3 may include a red pixel, a green pixel, and a blue pixel, and may further include a white pixel according to an embodiment.

The first pixel PX1 may include a first light emitting element LD1 and a first pixel circuit PC1 for driving the first light emitting element LD1, the second pixel PX2 may include a second light emitting element LD2 and a second pixel circuit PC2 for driving the second light emitting element LD2, and the third pixel PX3 may include a third light emitting element LD3 and a third pixel circuit PC3 for driving the third light emitting element LD3. The positions of the first pixel PX1, the second pixel PX2, and the third pixel PX3 illustrated in FIG. 4 are illustrated to respectively correspond to the positions of the first, second, and third light emitting elements LD1, LD2, and LD3.

The first area DP-A1 may overlap or may otherwise correspond to the sensing area 1000SA illustrated in FIG. 1. For example, the first area DP-A1 may be provided in an area overlapping the electronic module CM (see FIG. 2) when viewed in a plane (e.g., in a plan view). For example, an external input (e.g., light) may be provided to the electronic module CM through the first area DP-A1, and an output from the electronic module CM may be provided to an external source through the first area DP-A1. Although illustrated as a circular shape in this embodiment of the inventive concept, the first area DP-A1 may have various shapes such as a polygon, an ellipse, a figure having at least one curved side, and an atypical shape, and the present invention is not necessarily limited to any one embodiment.

To secure the surface area of a transmissive area, a smaller number of pixels may be provided in the first area DP-A1 than in the third area DP-A3. An area in the first area DP-A1 in which the first light emitting element LD1 is not disposed may be defined as the transmissive area. For example, in the first area DP-A1, an area in which a first pixel electrode of the first light emitting element LD1 and a pixel defining pattern surrounding the first pixel electrode are not disposed may be defined as the transmissive area.

Within a unit surface area or the same surface area, the number of the first pixels PX1 disposed in the first area DP-A1 may be less than the number of the third pixels PX3 disposed in the third area DP-A3. For example, the resolution of the first area DP-A1 may be about ½, about ⅜, about ⅓, about ¼, about ⅖, about ⅛, about ⅑, about 1/16, and the like of the resolution of the third area DP-A3. For example, the resolution of the third area DP-A3 may be about 400 ppi (pixels per inch) or larger, and the resolution of the first area DP-A1 may be about 200 ppi or about 100 ppi. However, this is only an example, and the present invention is not necessarily limited thereto.

The first pixel circuit PC1 of the first pixel PX1 might not be disposed in the first area DP-A1. For example, the first pixel circuit PC1 may be disposed in the second area DP-A2 or the peripheral area DP-NA. The light transmittance of the first area DP-A1 in this case may be higher than in the case that the first pixel circuit PC1 is disposed in the first area DP-A1.

The first light emitting element LD1 and the first pixel circuit PC1 may be electrically connected to each other through a connection line TWL. The connection line TWL may overlap the transmissive area of the first area DP-A1. The connection line TWL may include a transparent conductive line. The transparent conductive line may include a transparent conductive material or a light-transmissive material. For example, the connection line TWL may be formed of a film of transparent conductive oxide (TCO) such as indium tin oxide (ITO), indium zinc oxide (IZO), indium gallium zinc oxide (IGZO), zinc oxide (ZnO), and indium oxide ($In_2O_3$).

The second area DP-A2 is adjacent to the first area DP-A1. The second area DP-A2 may surround at least a portion of the first area DP-A1. The second area DP-A2 may have a lower transmittance of light than the first area DP-A1. In this embodiment of the inventive concept, the second area DP-A2 may be spaced apart from the peripheral area DP-NA. However, the second area DP-A2 is not necessarily limited thereto and may be in contact with the peripheral area DP-NA.

The first pixel circuit PC1 of the first pixel PX1, the second light emitting element LD2, and the second pixel circuit PC2 may be disposed in the second area DP-A2. Accordingly, the light transmittance of the second area DP-A2 may be lower than the light transmittance of the first area DP-A1. In addition, as the first pixel circuit PC1 of the first pixel PX1 is disposed in the second area DP-A2, the number of the second pixels PX2 disposed in the second area DP-A2 may be, within a unit surface area or the same surface area, less than the number of the third pixels PX3 disposed in the third area DP-A3. The resolution of an image displayed in the second area DP-A2 may be lower than the resolution of an image displayed in the third area DP-A3.

The third area DP-A3 may be adjacent to the second area DP-A2. The third area DP-A3 may be defined as an area having transmittance of light lower than that of the first area DP-A1. The third light emitting element LD3 and the third pixel circuit PC3 may be disposed in the third area DP-A3.

To secure space from the third light emitting element LD3 disposed in the third area DP-A3, a first light emitting element LD1n disposed in a portion of the first area DP-A1 disposed closest to the third area DP-A3 may have a circular shape having a larger width in a specific direction. For example, when the first area DP-A1 is adjacent to the third area DP-A3 in the second direction DR2, a width of the first light emitting element LD1n in the first direction DR1 may be greater than a width thereof in the second direction DR2.

Each of the first light emitting element LD1, the second light emitting element LD2, and the third light emitting element LD3 may be provided in plural. A distance between two first light emitting elements closest to each other among the first light emitting elements LD1 may be greater than a distance between two third light emitting elements closest to each other among the third light emitting elements LD3. In addition, a distance between two second light emitting elements closest to each other among the second light emitting elements LD2 may be greater than the distance between the two third light emitting elements closest to each other among the third light emitting elements LD3.

The first, second, and third light emitting elements LD1, LD2, and LD3 illustrated in FIG. 5 may respectively correspond to shapes viewed in a plane (e.g., in a plan view) of a first pixel electrode AE1 (see FIG. 7B) of the first light emitting element LD1, a second pixel electrode AE2 (see FIG. 7B) of the second light emitting element LD2, and a third pixel electrode AE3 (see FIG. 7A) of the third light emitting element LD3. A surface area of the first pixel electrode AE1 (see FIG. 7B) may be larger than a surface area of the third pixel electrode AE3 (see FIG. 7A).

Figure 6:
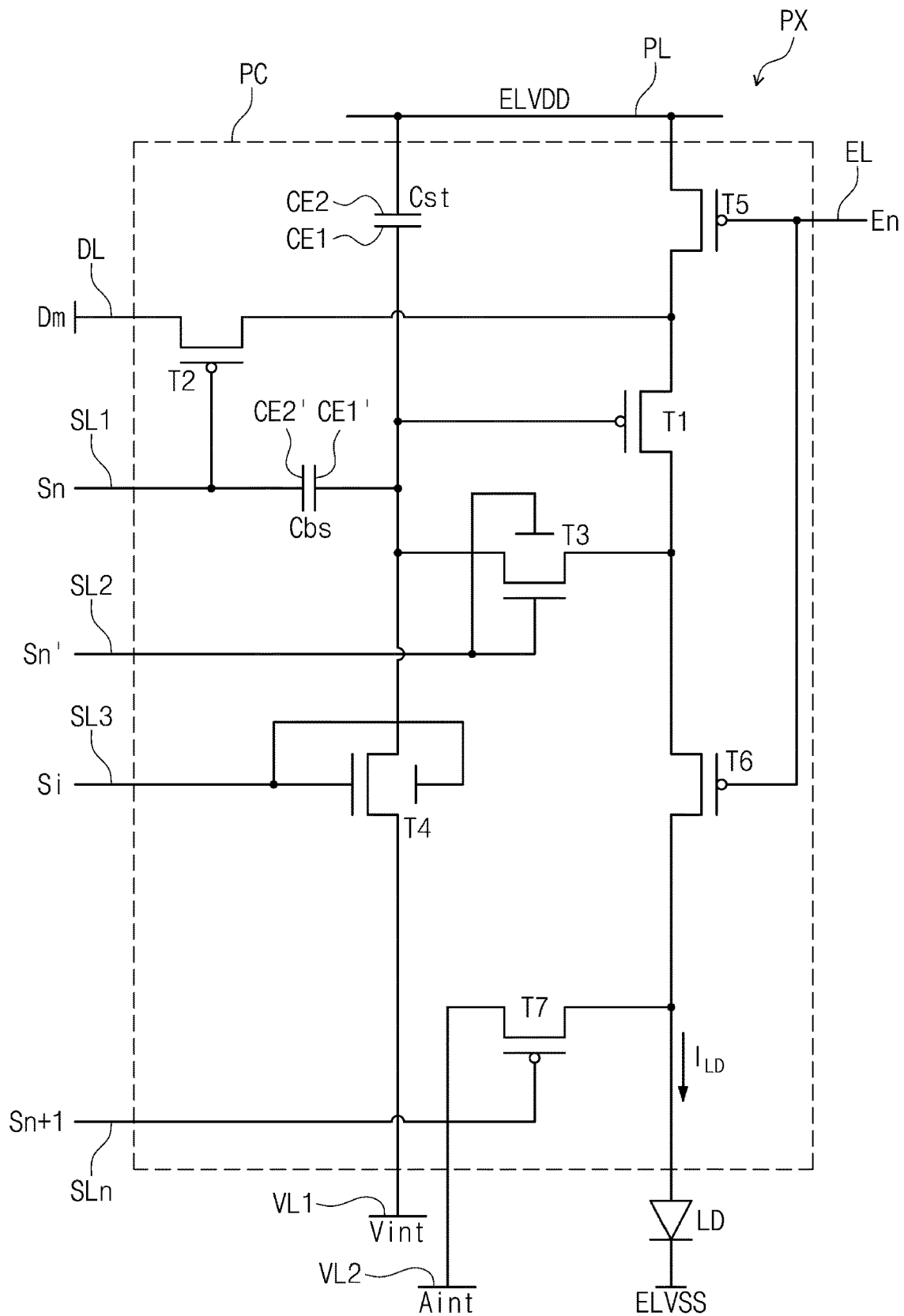
FIG. 6 is an equivalent circuit diagram of one of a plurality of similar pixels according to an embodiment of the inventive concept.

FIG. 6 is an equivalent circuit diagram of one of pixels according to an embodiment of the inventive concept.

Referring to FIG. 6, an equivalent circuit diagram of one pixel PX of the plurality of pixels PX is illustrated. The pixel PX illustrated in FIG. 6 may be the first pixel PX1 (see FIG. 4), the second pixel PX2 (see FIG. 4), or the third pixel PX3 (see FIG. 4). The pixel PX may include a light emitting element LD and a pixel circuit PC. The light emitting element LD may be a component included in the light emitting element layer 130 of FIG. 3, and the pixel circuit PC may be a component included in the circuit layer 120 of FIG. 3.

The pixel circuit PC may include a plurality of thin film transistors T1 to T7 and a storage capacitor Cst. The plurality of thin film transistors T1 to T7 and the storage capacitor Cst may be electrically connected to signal lines SL1, SL2, SL3, SLn, EL, and DL, a first initialization voltage line VL1, a second initialization voltage line VL2 (or an anode initialization voltage line), and a driving voltage line PL. In an embodiment of the inventive concept, at least one of the above-described lines, for example, the driving voltage line PL may be shared by neighboring pixels PX.

The plurality of thin film transistors T1 to T7 may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The light emitting element LD may include a first electrode (e.g., an anode electrode or a pixel electrode) and a second electrode (e.g., a cathode electrode or a common electrode), and the first electrode of the light emitting element LD may be connected to the driving thin film transistor T1 through the emission control thin film transistor T6 to receive a driving current $I_{LD}$, and the second electrode may receive a low power supply voltage ELVSS. The light emitting element LD may generate light having luminance corresponding to the driving current $I_{LD}$.

Some of the plurality of thin film transistors T1 to T7 may be provided as n-channel MOSFET (NMOS), and the others may be provided as p-channel MOSFET (PMOS). For example, the compensation thin film transistor T3 and the first initialization thin film transistor T4 among the plurality of thin film transistors T1 to T7 may be provided as n-channel MOSFET (NMOS), and the others may be provided as p-channel MOSFET (PMOS).

In an embodiment of the inventive concept, a compensation thin film transistor T3, a first initialization thin film transistor T4, and a second initialization thin film transistor T7 among a plurality of thin film transistors T1 to T7 may be provided as NMOS, and the rest may be provided as PMOS. Alternatively, only one of the plurality of thin film transistors T1 to T7 may be provided as NMOS, and the rest may be provided as PMOS. Alternatively, all of the plurality of thin film transistors T1 to T7 may be provided as NMOS, or all thereof may be provided as PMOS.

The signal lines may include a first scan line SL1 for transmitting a first scan signal Sn, a second scan line SL2 for transmitting a second scan signal Sn', a third scan line SL3 for transmitting a third scan signal Si to the first initialization thin film transistor T4, an emission control line EL for transmitting an emission control signal En to the operation control thin film transistor T5 and the emission control thin film transistor T6, a next scan line SLn for transmitting a next scan signal Sn+1 to the second initialization thin film transistor T7, and a data line DL that crosses the first scan line SL1 and transmits a data signal Dm. The first scan signal Sn may be a current scan signal, and the next scan signal Sn+1 may be a next scan signal of the first scan signal Sn.

The driving voltage line PL may transmit a driving voltage ELVDD to the driving thin film transistor T1, and the first initialization voltage line VL1 may transmit an initialization voltage Vint for initializing the driving thin film transistor T1 and the pixel electrode.

A driving gate electrode of the driving thin film transistor T1 may be connected to the storage capacitor Cst, a driving source region of the driving thin film transistor T1 may be connected to the driving voltage line PL via the operation control thin film transistor T5, and a driving drain region of the driving thin film transistor T1 may be electrically connected to the first electrode of the light emitting element LD via the emission control thin film transistor T6. The driving thin film transistor T1 may receive the data signal Dm according to the switching operation of the switching thin film transistor T2 to provide the driving current $I_{LD}$ to the light emitting element LD.

A switching gate electrode of the switching thin film transistor T2 may be connected to the first scan line SL1 transmitting the first scan signal Sn, a switching source region of the switching thin film transistor T2 may be connected to the data line DL, and a switching drain region of the switching thin film transistor T2 may be connected to the driving source region of the driving thin film transistor T1 and connected to the driving voltage line PL via the operation control thin film transistor T5. The switching thin film transistor T2 may perform a switching operation in which the switching thin film transistor T2 is turned on according to the first scan signal Sn transmitted through the first scan line SL1 and transmits, to the driving source region of the driving thin film transistor T1, the data signal Dm transmitted through the data line DL.

A compensation gate electrode of the compensation thin film transistor T3 is connected to the second scan line SL2. A compensation drain region of the compensation thin film transistor T3 may be connected to the driving drain region of the driving thin film transistor T1 and may be connected to the pixel electrode of the light emitting element LD via the emission control thin film transistor T6. A compensation source region of the compensation thin film transistor T3 may be connected to a first electrode CE1 of the storage capacitor Cst and the driving gate electrode of the driving thin film transistor T1. In addition, the compensation source region may be connected to a first initialization drain region of the first initialization thin film transistor T4.

The compensation thin film transistor T3 may be turned on according to the second scan signal Sn' received through the second scan line SL2 and may electrically connect the driving gate electrode and the driving drain region of the driving thin film transistor T1 to diode-connect the driving thin film transistor T1.

A first initialization gate electrode of the first initialization thin film transistor T4 may be connected to the third scan line SL3. A first initialization source region of the first initialization thin film transistor T4 may be connected to a second initialization source region of the second initialization thin film transistor T7 and the first initialization voltage line VL1. The first initialization drain region of the first initialization thin film transistor T4 may be connected to the first electrode CE1 of the storage capacitor Cst, the compensation source region of the compensation thin film transistor T3, and the driving gate electrode of the driving thin film transistor T1. The first initialization thin film transistor T4 may be turned on according to the third scan signal Si received through the third scan line SL3 and may perform an initialization operation in which the first initialization thin film transistor T4 transmits the initialization voltage Vint to the driving gate electrode of the driving thin film transistor T1 to initialize a voltage of the driving gate electrode of the driving thin film transistor T1.

An operation control gate electrode of the operation control thin film transistor T5 may be connected to the emission control line EL, an operation control source region of the operation control thin film transistor T5 may be connected to the driving voltage line PL, and an operation control drain region of the operation control thin film transistor T5 may be connected to the driving source region of the driving thin film transistor T1 and the switching drain region of the switching thin film transistor T2.

An emission control gate electrode of the emission control thin film transistor T6 may be connected to the emission control line EL, an emission control source region of the emission control thin film transistor T6 may be connected to the driving drain region of the driving thin film transistor T1 and the compensation drain region of the compensation thin film transistor T3, and an emission control drain region of the emission control thin film transistor T6 may be electrically connected to a second initialization drain region of the second initialization thin film transistor T7 and the pixel electrode of the light emitting element LD.

The operation control thin film transistor T5 and the emission control thin film transistor T6 may be simultaneously turned on according to the emission control signal En received through the emission control line EL and may allow the driving voltage ELVDD to be applied to the light emitting element LD for the driving current $I_{LD}$ to flow through the light emitting element LD.

A second initialization gate electrode of the second initialization thin film transistor T7 may be connected to the next scan line SLn, the second initialization drain region of the second initialization thin film transistor T7 may be connected to the emission control drain region of the emission control thin film transistor T6 and the pixel electrode of the light emitting element LD, and the second initialization source region of the second initialization thin film transistor T7 may be connected to the second initialization voltage line VL2 to receive an anode initialization voltage Aint. The second initialization thin film transistor T7 is turned on according to the next scan signal Sn+1 transmitted through the next scan line SLn and initializes the pixel electrode of the light emitting element LD.

In an embodiment of the inventive concept, a second initialization thin film transistor T7 may be connected to an emission control line EL to be driven according to an emission control signal En. The positions of source regions and drain regions may be interchanged according to the type (p-type or n-type) of a transistor.

The storage capacitor Cst may include the first electrode CE1 and a second electrode CE2. The first electrode CE1 of the storage capacitor Cst is connected to the driving gate electrode of the driving thin film transistor T1, and the second electrode CE2 of the storage capacitor Cst is connected to the driving voltage line PL. The storage capacitor Cst may store an electric charge corresponding to a difference between a voltage of the driving gate electrode of the driving thin film transistor T1 and the driving voltage ELVDD.

A boosting capacitor Cbs may include a first electrode CE1' and a second electrode CE2'. The first electrode CE1' of the boosting capacitor Cbs may be connected to the first electrode CE1 of the storage capacitor Cst, and the second electrode CE2' of the boosting capacitor Cbs may receive the first scan signal Sn. The boosting capacitor Cbs may compensate for the voltage drop of a gate terminal of the driving thin film transistor T1 by increasing a voltage of the gate terminal at the point in time when the provision of the first scan signal Sn is stopped.

A detailed operation of each of the pixels PX according to an embodiment is as follows.

When the third scan signal Si is provided through the third scan line SL3 during an initialization period, the first initialization thin film transistor T4 is turned on in response to the third scan signal Si, and the driving thin film transistor T1 is initialized by the initialization voltage Vint provided from the first initialization voltage line VL1.

When the first scan signal Sn and the second scan signal Sn' are provided through the first scan line SL1 and the second scan line SL2, respectively, during a data programming period, the switching thin film transistor T2 and the compensation thin film transistor T3 are turned on in response to the first scan signal Sn and the second scan signal Sn', respectively. At this time, the driving thin film transistor T1 is diode-connected by the turned-on compensation thin film transistor T3 and is forward-biased.

Then, a compensation voltage Dm+Vth obtained by adding the data signal Dm provided from the data line DL and a threshold voltage Vth (here, Vth is a negative value) of the driving thin film transistor T1 is applied to the driving gate electrode of the driving thin film transistor T1.

The driving voltage ELVDD and the compensation voltage Dm+Vth are respectively applied to both ends of the storage capacitor Cst, and an electric charge corresponding to a voltage difference between the two ends is stored in the storage capacitor Cst.

During an emission period, the operation control thin film transistor T5 and the emission control thin film transistor T6 are turned on by the emission control signal En provided from the emission control line EL. The driving current $I_{LD}$ is generated according to a voltage difference between a voltage of the driving gate electrode of the driving thin film transistor T1 and the driving voltage ELVDD, and the driving current $I_{LD}$ is provided to the light emitting element LD through the emission control thin film transistor T6.

In this embodiment of the inventive concept, at least one of the plurality of thin film transistors T1 to T7 includes a semiconductor layer including oxide, and the rest thereof include a semiconductor layer including silicon.

For example, the driving thin film transistor T1, which directly affects the brightness of a display device, may be formed to include a semiconductor layer made of polycrystalline silicon having high reliability, thereby realizing a high-resolution display device.

On the other hand, due to high carrier mobility and a low leakage current, a voltage drop of an oxide semiconductor is not large even when the driving time is long. For example, the oxide semiconductor is capable of low-frequency driving because the color change of an image caused by the voltage drop is not big even during the low-frequency driving.

As described above, because the oxide semiconductor may exhibit a low leakage current, by employing the oxide semiconductor for at least one of the compensation thin film transistor T3, the first initialization thin film transistor T4, or the second initialization thin film transistor T7 that are connected to the driving gate electrode of the driving thin film transistor T1, it is possible to prevent or reduce a leakage current that may flow into the driving gate electrode and at the same time, to reduce power consumption.

Figure 7A:
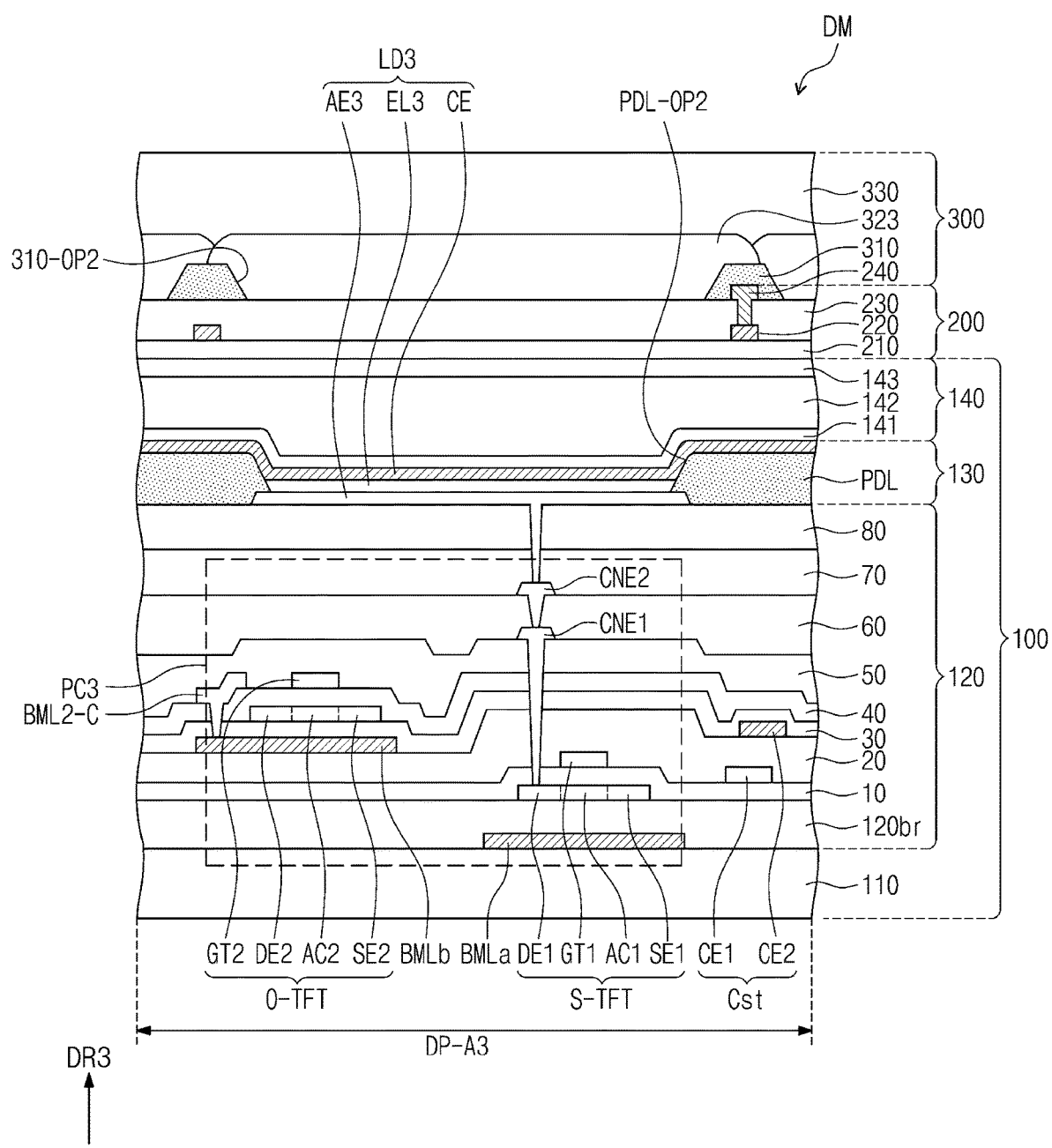
FIG. 7A is a cross-sectional view of a display module according to an embodiment of the inventive concept.
Figure 7B:
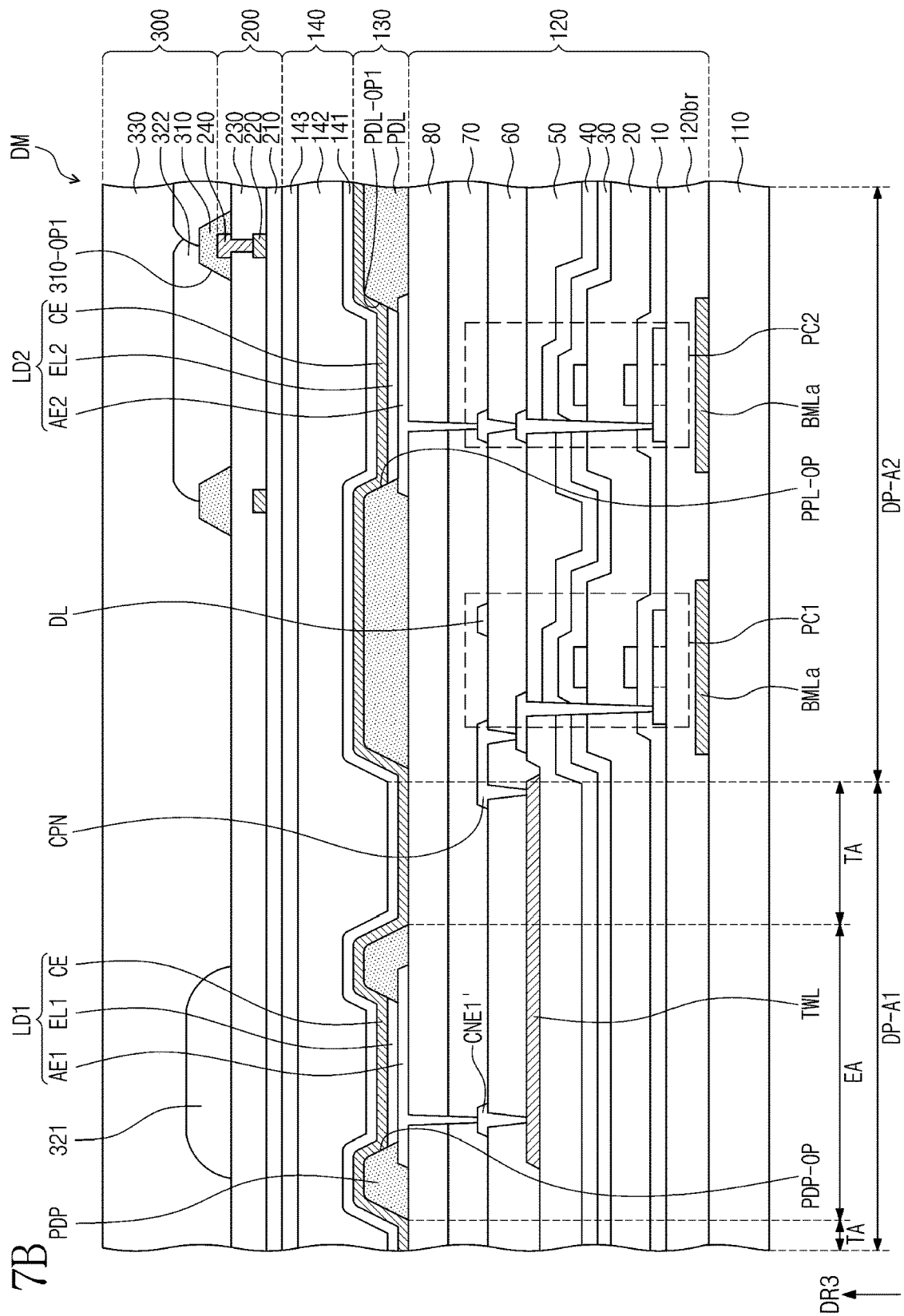
FIG. 7B is a cross-sectional view of a display module according to an embodiment of the inventive concept.

FIG. 7A is a cross-sectional view of a display module according to an embodiment of the inventive concept. FIG. 7B is a cross-sectional view of a display module according to an embodiment of the inventive concept. FIG. 7A is a cross-sectional view of a portion including the third area DP-A3, and FIG. 7B is a cross-sectional view of a portion including the first area DP-A1 and the second area DP-A2.

Referring to FIG. 7A and FIG. 7B, the display panel 100 may include a plurality of insulating layers, the semiconductor pattern, the conductive pattern, the signal line, and the like. Each of the insulating layers, a semiconductor layer, and a conductive layer are formed by a method such as coating and deposition. Thereafter, the insulating layer, the semiconductor layer, and the conductive layer may be selectively patterned by a photolithography method. In this manner, the semiconductor pattern, the conductive pattern, the signal line, and the like included in the circuit layer 120 and the light emitting element layer 130 are formed. Thereafter, the encapsulation layer 140 covering the light emitting element layer 130 may be formed.

FIG. 7A illustrates the third light emitting element LD3, and a silicon thin film transistor S-TFT and an oxide thin film transistor O-TFT of the third pixel circuit PC3 (see FIG. 5). FIG. 7B illustrates the first light emitting element LD1, the first pixel circuit PC1, the second light emitting element LD2, and the second pixel circuit PC2.

A buffer layer 120*br* may be disposed on the base layer 110. The buffer layer 120*br* may prevent or reduce metal atoms or impurities from diffusing from the base layer 110 into a first semiconductor pattern. In addition, the buffer layer 120*br* may control a heat supply rate during a crystallization process for forming the first semiconductor pattern, so that the first semiconductor pattern may be uniformly formed.

A first back metal layer BMLa may be disposed on a lower portion of the silicon thin film transistor S-TFT, and a second back metal layer BMLb may be disposed on a lower portion of the oxide thin film transistor O-TFT. The first and second back metal layers BMLa and BMLb may overlap the first to third pixel circuits PC1, PC2, and PC3 to protect the first to third pixel circuits PC1, PC2, and PC3. The first and second back metal layers BMLa and BMLb may block an electric potential due to the polarization of the base layer 110 from affecting the first to third pixel circuits PC1, PC2, and PC3.

The first back metal layer BMLa may correspond to at least a partial area of the pixel circuit PC (see FIG. 6). In an embodiment of the inventive concept, the first back metal layer BMLa may overlap the driving thin film transistor T1 (see FIG. 6) provided as the silicon thin film transistor S-TFT.

The first back metal layer BMLa may be disposed between the base layer 110 and the buffer layer 120*br*. In an embodiment of the inventive concept, the first back metal layer BMLa may be disposed on the base layer 110 in which an organic film and an inorganic film are alternately laminated, and an inorganic barrier layer may be further disposed between the first back metal layer BMLa and the buffer layer 120*br*. The first back metal layer BMLa may be connected to an electrode or a line to receive a constant voltage or a signal therefrom. In an embodiment of the inventive concept, a first back metal layer BMLa may be provided in a form in which the first back metal layer BMLa is isolated from other electrodes or lines.

The second back metal layer BMLb may correspond to a lower portion of the oxide thin film transistor O-TFT. The second back metal layer BMLb may be disposed between a second insulating layer 20 and a third insulating layer 30. The second back metal layer BMLb may be disposed on the same layer as the second electrode CE2 of the storage capacitor Cst. The second back metal layer BMLb may be connected to a contact electrode BML2-C to receive a constant voltage or a signal. The contact electrode BML2-C may be disposed on the same layer as a second gate electrode GT2 of the oxide thin film transistor O-TFT.

Each of the first back metal layer BMLa and the second back metal layer BMLb may include a reflective metal. For example, each of the first back metal layer BMLa and the second back metal layer BMLb may include silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), titanium (Ti), p+ doped amorphous silicon, and the like. The first back metal layer BMLa and the second back metal layer BMLb may include the same material or different materials.

The first semiconductor pattern may be disposed on the buffer layer 120*br*. The first semiconductor pattern may include a silicon semiconductor. For example, the silicon semiconductor may include amorphous silicon, polycrystalline silicon (i.e., polysilicon), or the like. For example, the first semiconductor pattern may include low-temperature polysilicon.

FIG. 7A only illustrates a portion of the first semiconductor pattern disposed on the buffer layer 120*br*, and another portion of the first semiconductor pattern may be further disposed in another area. The first semiconductor pattern may be arranged in a specific rule across the pixels. The first semiconductor pattern may have different electrical properties according to whether it is doped. The first semiconductor pattern may include a first region having relatively high conductivity and a second region having relatively low conductivity. The first region may be doped with an N-type dopant or a P-type dopant. A P-type transistor may include a doped region doped with the P-type dopant, and an N-type transistor may include a doped region doped with the N-type dopant. The second region may be a non-doped region, or a region doped at a lower concentration than the first region.

The conductivity of the first region is higher than that of the second region, and the first region may substantially serve as an electrode or a signal line. The second region may substantially correspond to an active region (e.g., a channel) of a transistor. For example, a portion of the semiconductor pattern may be the active region of the transistor, another portion may be a source region or drain region of the transistor, and another portion may be a connection electrode or a connection signal line.

A source region SE1, an active region AC1, and a drain region DE1 of the silicon thin film transistor S-TFT may be formed from the first semiconductor pattern. The source region SE1 and the drain region DE1 may respectively extend in opposite directions from the active region AC1 on a cross section.

A first insulating layer 10 may be disposed on the buffer layer 120*br*. The first insulating layer 10 may overlap the plurality of pixels in common and cover the first semiconductor pattern. The first insulating layer 10 may be an inorganic layer and/or an organic layer and may have a single-layer structure or a multilayer structure. The first insulating layer 10 may include aluminum oxide, titanium oxide, silicon oxide, silicon nitride, silicon oxynitride, zirconium oxide, and/or hafnium oxide. In this embodiment of the inventive concept, the first insulating layer 10 may be a single-layer silicon oxide layer. In addition to the first insulating layer 10, an insulating layer of the circuit layer 120 to be described later may be an inorganic layer and/or an organic layer and may have a single-layer structure or a multilayer structure. The inorganic layer may include at least one of the above-described materials but is not necessarily limited thereto.

A first gate electrode GT1 of the silicon thin film transistor S-TFT is disposed on the first insulating layer 10. The first gate electrode GT1 may be a portion of a metal pattern. The first gate electrode GT1 overlaps the active region AC1. In a process of doping the first semiconductor pattern, the first gate electrode GT1 may function as a mask. The first gate electrode GT1 may include titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), indium zinc oxide (IZO), and the like, but the present invention is not necessarily limited thereto.

The second insulating layer 20 may be disposed on the first insulating layer 10 and may cover the first gate electrode GT1. The second insulating layer 20 may be an inorganic layer and/or an organic layer and may have a single-layer structure or a multilayer structure. The second insulating layer 20 may include silicon oxide, silicon nitride, and/or silicon oxynitride. In this embodiment of the inventive concept, the second insulating layer 20 may have a multi-layer structure including a silicon oxide layer and a silicon nitride layer.

The third insulating layer 30 may be disposed on the second insulating layer 20. The third insulating layer 30 may have a single-layer structure or a multilayer structure. For example, the third insulating layer 30 may have a multilayer structure including a silicon oxide layer and a silicon nitride layer. The second electrode CE2 of the storage capacitor Cst may be disposed between the second insulating layer 20 and the third insulating layer 30. In addition, the first electrode CE1 of the storage capacitor Cst may be disposed between the first insulating layer 10 and the second insulating layer 20.

A second semiconductor pattern may be disposed on the third insulating layer 30. The second semiconductor pattern may include an oxide semiconductor. The oxide semiconductor may include a plurality of regions divided according to whether a metal oxide is reduced. A region in which the metal oxide is reduced (hereinafter, referred to as a reduction region) has a higher conductivity than a region in which the metal oxide is not reduced (hereinafter, referred to as a non-reduction region). The reduction region substantially serves as a source/drain of the transistor or a signal line. The non-reduction region substantially corresponds to an active region (e.g., a semiconductor region or the channel) of the transistor. For example, a portion of the second semiconductor pattern may be the active region of the transistor, another portion may be a source/drain region of the transistor, and another portion may be a signal transmission region.

A source region SE2, an active region AC2, and a drain region DE2 of the oxide thin film transistor O-TFT may be formed from the second semiconductor pattern. The source region SE2 and the drain region DE2 may respectively extend in opposite directions from the active region AC2 on a cross section.

A fourth insulating layer 40 may be disposed on the third insulating layer 30. The fourth insulating layer 40 may overlap the plurality of pixels in common and cover the second semiconductor pattern. The fourth insulating layer 40 may include aluminum oxide, titanium oxide, silicon oxide, silicon nitride, silicon oxynitride, zirconium oxide, and/or hafnium oxide.

The second gate electrode GT2 of the oxide thin film transistor O-TFT is disposed on the fourth insulating layer 40. The second gate electrode GT2 may be a portion of a metal pattern. The second gate electrode GT2 overlaps the active region AC2. In a process of doping the second semiconductor pattern, the second gate electrode GT2 may function as a mask.

A fifth insulating layer 50 may be disposed on the fourth insulating layer 40 and may cover the second gate electrode GT2. The fifth insulating layer 50 may be an inorganic layer and/or an organic layer and may have a single-layer structure or a multilayer structure.

A first connection electrode CNE1 may be disposed on the fifth insulating layer 50. The first connection electrode CNE1 may be connected to the drain region DE1 of the silicon thin film transistor S-TFT through a contact hole penetrating the first to fifth insulating layers 10, 20, 30, 40, and 50.

A sixth insulating layer 60 may be disposed on the fifth insulating layer 50. A second connection electrode CNE2 may be disposed on the sixth insulating layer 60. The second connection electrode CNE2 may be connected to the first connection electrode CNE1 through a contact hole penetrating the sixth insulating layer 60. A seventh insulating layer 70 may be disposed on the sixth insulating layer 60 and may cover the second connection electrode CNE2. An eighth insulating layer 80 may be disposed on the seventh insulating layer 70.

Each of the sixth insulating layer 60, the seventh insulating layer 70, and the eighth insulating layer 80 may be an organic layer. For example, each of the sixth insulating layer 60, the seventh insulating layer 70, and the eighth insulating layer 80 may include general-purpose polymers such as benzocyclobutene (BCB), polyimide, hexamethyldisiloxane (HMDSO), polymethylmethacrylate (PMMA), and polystyrene (PS), a polymer derivative having phenolic groups, an acrylic polymer, an imide-based polymer, an arylether-based polymer, an amide-based polymer, a fluorine-based polymer, a p-xylene-based polymer, a vinyl alcohol-based polymer, and a blend thereof.

The light emitting element layer 130 including the first to third light emitting elements LD1, LD2, and LD3 may be disposed on the circuit layer 120. The first light emitting element LD1 may include the first pixel electrode AE1, a first light emitting layer EL1, and a common electrode CE, the second light emitting element LD2 may include the second pixel electrode AE2, a second light emitting layer EL2, and the common electrode CE, and the third light emitting element LD3 may include the third pixel electrode AE3, a third light emitting layer EL3, and the common electrode CE. The common electrode CE may be connected to the pixels PX (see FIG. 4) and provided in common.

The first pixel electrode AE1, the second pixel electrode AE2, and the third pixel electrode AE3 may be disposed on the eighth insulating layer 80. Each of the first pixel electrode AE1, the second pixel electrode AE2, and the third pixel electrode AE3 may be a (semi-)transmissive electrode or a reflective electrode. In an embodiment of the inventive concept, each of the first pixel electrode AE1, the second pixel electrode AE2, and the third pixel electrode AE3 may include a reflective layer formed of Ag, Mg, Al, Pt, Pd, Au, Ni, Nd, Ir, Cr, or a compound thereof, and a transparent or translucent electrode layer formed on the reflective layer. The transparent or translucent electrode layer may include at least one selected from a group consisting of indium tin oxide (ITO), indium zinc oxide (IZO), indium gallium zinc oxide (IGZO), zinc oxide (ZnO) or indium oxide ($In_2O_3$), and aluminum-doped zinc oxide (AZO). For example, each of the first pixel electrode AE1, the second pixel electrode AE2, and the third pixel electrode AE3 may be formed of ITO/Ag/ITO.

A pixel defining film PDL and a pixel defining pattern PDP may be disposed on the eighth insulating layer 80. The pixel defining film PDL and the pixel defining pattern PDP may include a same material and may be formed through the same process. Each of the pixel defining film PDL and the pixel defining pattern PDP may have a property of absorbing light and may have, e.g., a black color. Each of the pixel defining film PDL and the pixel defining pattern PDP may include a black coloring agent. The black coloring agent may include a black dye or a black pigment. The black coloring agent may include carbon black, a metal such as chromium, or an oxide thereof.

The pixel defining pattern PDP may be disposed in the first area DP-A1. The pixel defining pattern PDP may cover a portion of the first pixel electrode AE1. For example, the pixel defining pattern PDP may cover an edge of the first pixel electrode AE1. When viewed in a plane (e.g., in a plan view), the pixel defining pattern PDP may have a ring shape. "When viewed in a plane" may mean "when viewed in the third direction DR3".

The pixel defining film PDL may be disposed in the second area DP-A2 and the third area DP-A3. The pixel defining film PDL may cover a portion of each of the second pixel electrode AE2 and the third pixel electrode AE3. For example, a first opening PDL-OP1 exposing a portion of the second pixel electrode AE2 and a second opening PDL-OP2 exposing a portion of the third pixel electrode AE3 may be defined in the pixel defining film PDL.

The pixel defining pattern PDP may increase a distance between the edge of the first pixel electrode AE1 and the common electrode CE, and the pixel defining film PDL may increase a distance between an edge of each of the second and third pixel electrodes AE2 and AE3 and the common electrode CE. Accordingly, the pixel defining pattern PDP and the pixel defining film PDL may serve to prevent or reduce electrical arcing from occurring at the edge of each of the first, second, and third pixel electrodes AE1, AE2, and AE3.

In the first area DP-A1, an area overlapping a portion where the first pixel electrode AE1 and the pixel defining pattern PDP are disposed may be defined as an element area EA, and the remaining area may be defined as a transmissive area TA.

The first pixel electrode AE1 may be electrically connected to the first pixel circuit PC1 disposed in the second area DP-A2. For example, the first pixel electrode AE1 may be electrically connected to the first pixel circuit PC1 through the connection line TWL and a connection bridge CPN. In this case, the connection line TWL may overlap the transmissive area TA. Accordingly, the connection line TWL may include a light-transmissive material.

The connection line TWL may be disposed between the fifth insulating layer 50 and the sixth insulating layer 60 but the present invention is not necessarily limited thereto. The connection bridge CPN may be disposed between the sixth insulating layer 60 and the seventh insulating layer 70. The connection bridge CPN may be connected to the connection line TWL and the first pixel circuit PC1.

The first light emitting layer EL1 may be disposed on the first pixel electrode AE1, the second light emitting layer EL2 may be disposed on the second pixel electrode AE2, and the third light emitting layer EL3 may be disposed on the third pixel electrode AE3. In this embodiment of the inventive concept, each of the first to third light emitting layers EL1, EL2, and EL3 may emit light of at least one color of blue, red, or green.

The common electrode CE may be disposed on the first to third light emitting layers EL1, EL2, and EL3. The common electrode CE may have an integral shape and may be disposed in common in the plurality of pixels PX (see FIG. 4).

A hole control layer may be disposed between the first to third pixel electrodes AE1, AE2, and AE3 and the first to third light emitting layers EL1, EL2, and EL3. The hole control layer may include a hole transport layer and may further include a hole injection layer. An electron control layer may be disposed between the first to third light emitting layers EL1, EL2, and EL3 and the common electrode CE. The electron control layer may include an electron transport layer and may further include an electron injection layer. The hole control layer and the electron control layer may be formed in common in the plurality of pixels PX (see FIG. 4), for example, by using an open mask.

The encapsulation layer 140 may be disposed on the light emitting element layer 130. The encapsulation layer 140 may include an inorganic layer 141, an organic layer 142, and an inorganic layer 143 that are sequentially laminated, but layers constituting the encapsulation layer 140 are not necessarily limited thereto.

The inorganic layers 141 and 143 may protect the light emitting element layer 130 from moisture and oxygen, and the organic layer 142 may protect the light emitting element layer 130 from foreign matter such as dust particles. The inorganic layers 141 and 143 may include a silicon nitride layer, a silicon oxynitride layer, a silicon oxide layer, a titanium oxide layer, an aluminum oxide layer, or the like. The organic layer 142 may include an acrylate-based organic layer but is not necessarily limited thereto.

The sensor layer 200 may be disposed on the display panel 100. The sensor layer 200 may be referred to as a sensor, an input sensing layer, or an input sensing panel. The sensor layer 200 may include a base layer 210, a first conductive layer 220, a sensing insulating layer 230, and a second conductive layer 240.

The base layer 210 may be directly disposed on the display panel 100. The base layer 210 may be an inorganic layer including silicon nitride, silicon oxynitride, and/or silicon oxide. Alternatively, the base layer 210 may be an organic layer including epoxy resin, acrylic resin, or imide-based resin. The base layer 210 may have a single-layer structure or a multilayer structure laminated in the third direction DR3.

Each of the first conductive layer 220 and the second conductive layer 240 may have a single-layer structure or a multilayer structure laminated in the third direction DR3.

The conductive layer of the single-layer structure may include a metal layer or a transparent conductive layer. The metal layer may include molybdenum, silver, titanium, copper, aluminum, or an alloy thereof. The transparent conductive layer may include transparent conductive oxide such as indium tin oxide (ITO), indium zinc oxide (IZO), zinc oxide (ZnO), and/or indium zinc tin oxide (IZTO). In addition, the transparent conductive layer may include a conductive polymer such as PEDOT, metal nanowires, graphene, and the like.

The conductive layer of the multilayer structure may include metal layers. The metal layers may have, for example, a three-layer structure of titanium/aluminum/titanium. The conductive layer of the multilayer structure may include at least one metal layer and at least one transparent conductive layer.

The sensing insulating layer 230 may be disposed between the first conductive layer 220 and the second conductive layer 240. The sensing insulating layer 230 may include an inorganic film. The inorganic film may include aluminum oxide, titanium oxide, silicon oxide, silicon nitride, silicon oxynitride, zirconium oxide, and/or hafnium oxide.

Alternatively, the sensing insulating layer 230 may include an organic film. The organic film may include acrylate-based resin, methacrylate-based resin, polyisoprene, vinyl-based resin, epoxy-based resin, urethane-based resin, cellulose-based resin, siloxane-based resin, polyimide-based resin, polyamide-based resin, and/or perylene-based resin.

The anti-reflection layer 300 may be disposed on the sensor layer 200. The anti-reflection layer 300 may include a division layer 310, a first color filter 321, a second color filter 322, a third color filter 323, and a planarization layer 330.

A material constituting the division layer 310 is not necessarily limited thereto as long as the material absorbs light. The division layer 310 may be a layer having a black color, and in an embodiment of the inventive concept, the division layer 310 may include a black coloring agent. The black coloring agent may include a black dye or a black pigment. The black coloring agent may include carbon black, a metal such as chromium, or an oxide thereof.

The division layer 310 may cover the second conductive layer 240 of the sensor layer 200. The division layer 310 may prevent or reduce reflection of external light by the second conductive layer 240. The division layer 310 may overlap the second area DP-A2 and the third area DP-A3 and might not overlap the first area DP-A1. For example, a portion of the division layer 310 overlapping the first area DP-A1 may be removed. Accordingly, transmittance of light in the first area DP-A1 may be further increased.

A plurality of openings 310-OP1 and 310-OP2 may be defined in the division layer 310. A first opening 310-OP1 may overlap the second pixel electrode AE2, and a second opening 310-OP2 may overlap the third pixel electrode AE3.

The first color filter 321 may overlap the first area DP-A1, the second color filter 322 may overlap the second area DP-A2, and the third color filter 323 may overlap the third area DP-A3. The first color filter 321 may overlap the first pixel electrode AE1, the second color filter 322 may overlap the second pixel electrode AE2, and the third color filter 323 may overlap the third pixel electrode AE3.

Because the division layer 310 does not overlap the first area DP-A1, the first color filter 321 may be spaced apart from the division layer 310. For example, the first color filter 321 might not be in contact with the division layer 310. The second color filter 322 may cover the first opening 310-OP1, and the third color filter 323 may cover the second opening 310-OP2. Each of the second color filter 322 and the third color filter 323 may be in contact with the division layer 310. Opening surface areas of the first and second openings 310-OP1 and 310-OP2 of the division layer 310 may be respectively larger than opening surface areas of the first and second openings PDL-OP1 and PDL-OP2 of the pixel defining film PDL.

The planarization layer 330 may cover the division layer 310, the first color filter 321, the second color filter 322, and the third color filter 323. The planarization layer 330 may include an organic material and may provide a flat surface on a top surface of the planarization layer 330. In an embodiment of the inventive concept, the planarization layer 330 may be omitted.

Figure 8:
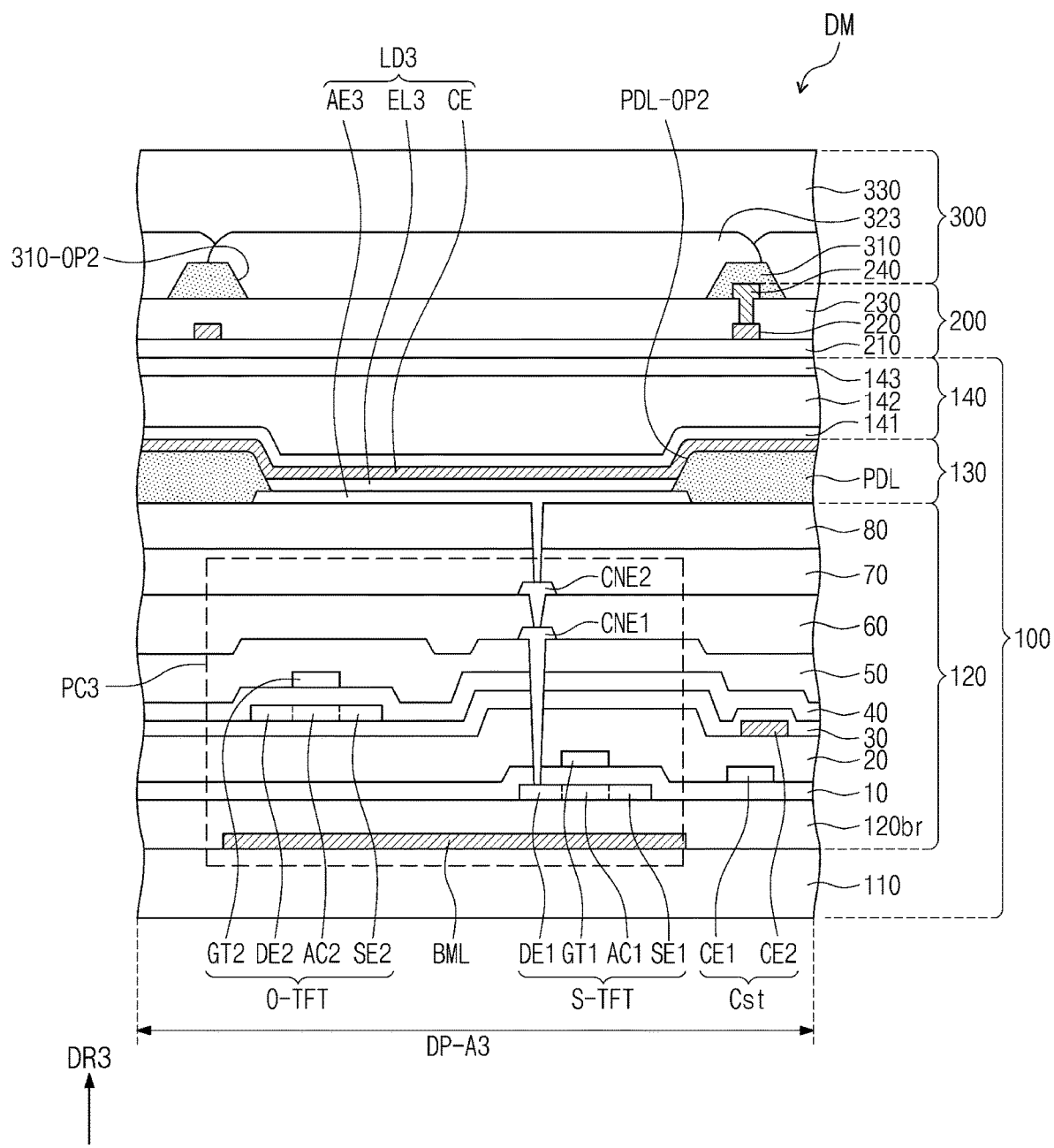
FIG. 8 is a cross-sectional view of a display module according to an embodiment of the inventive concept.

FIG. 8 is a cross-sectional view of a display module according to an embodiment of the inventive concept. In the description of FIG. 8, a difference between FIG. 7A and FIG. 8 will be mainly described and to the extent that an element is not described in detail, it may be assumed that the element is at least similar to a corresponding element described elsewhere within the instant specification.

Referring to FIG. 7B and FIG. 8, a back metal layer BML may be disposed between a base layer 110 and a buffer layer 120br. The back metal layer BML may overlap first to third pixel circuits PC1, PC2, and PC3 to protect the first to third pixel circuits PC1, PC2, and PC3. The back metal layer BML may block an electric potential due to the polarization of the base layer 110 from affecting the first to third pixel circuits PC1, PC2, and PC3.

The back metal layer BML may correspond to the entirety of a display area DP-A (see FIG. 4) and may include a hole in an area corresponding to a first area DP-A1. For example, the back metal layer BML might not overlap the first area DP-A1. In an embodiment of the inventive concept, a back metal layer BML may be omitted.

Figure 9:
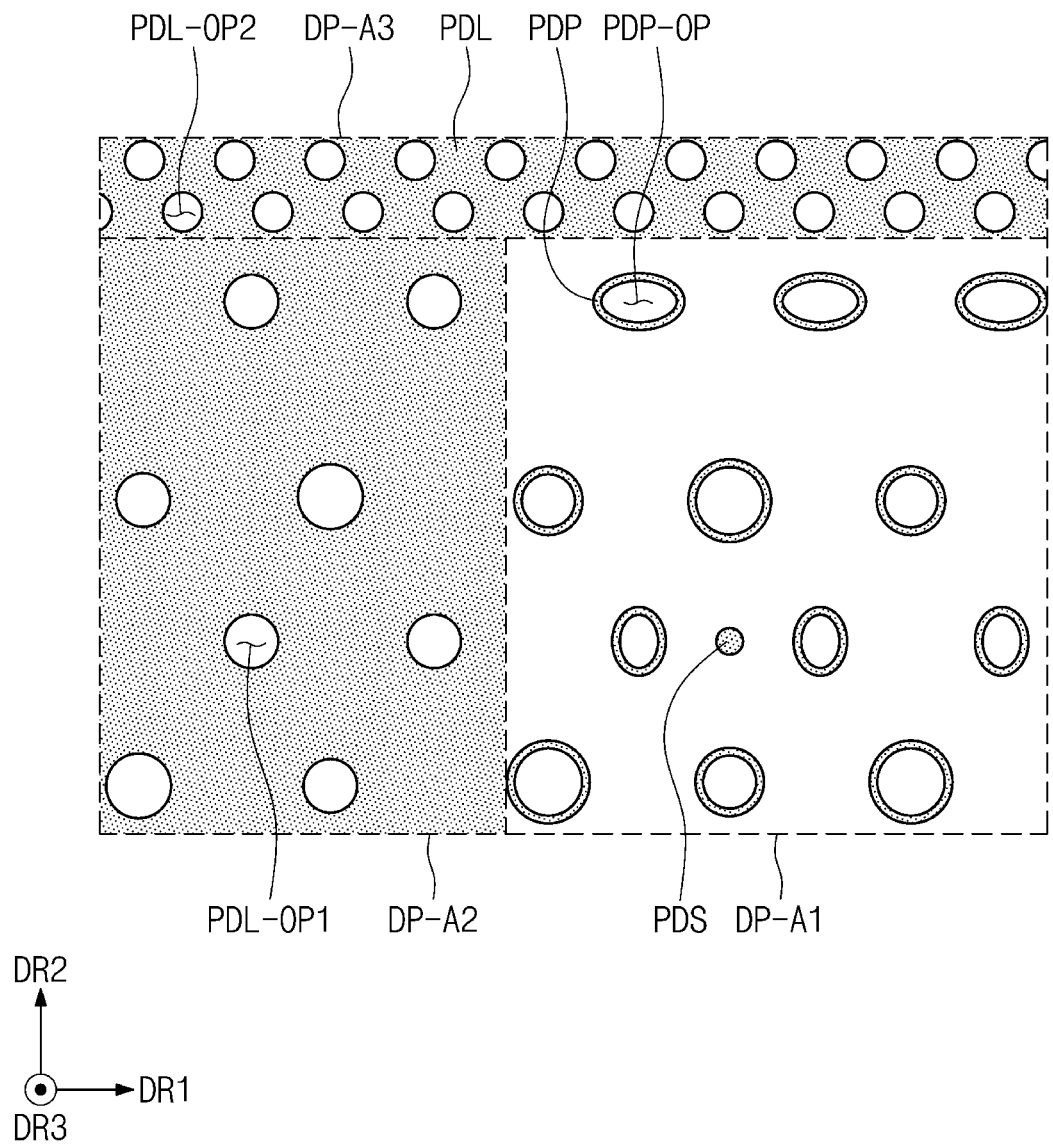
FIG. 9 is a plan view illustrating a pixel defining film and a pixel defining pattern according to an embodiment of the inventive concept.

FIG. 9 is a plan view illustrating the pixel defining film PDL and the pixel defining pattern PDP according to an embodiment of the inventive concept. For example, FIG. 9 illustrates a portion of the pixel defining film PDL, a portion of the pixel defining pattern PDP, and a spacer PDS disposed in a portion corresponding to the area AA' of FIG. 4.

Referring to FIG. 7B and FIG. 9, the pixel defining film PDL may be disposed in the second area DP-A2 and the third area DP-A3. The pixel defining film PDL might not overlap the first area DP-A1. Because the pixel defining film PDL having a black color is not disposed in the first area DP-A1, transmittance of light of the first area DP-A1 may be increased.

The pixel defining pattern PDP may be disposed in the first area DP-A1. The pixel defining pattern PDP may be provided in plural, and the plurality of pixel defining patterns PDP may be spaced apart from each other. An opening PDP-OP may be defined in the pixel defining pattern PDP. The opening PDP-OP may be defined in an area overlapping the first pixel electrode AE1. For example, one pixel defining pattern PDP may have a shape that covers an edge of one first pixel electrode AE1. Accordingly, when viewed in a plane (e.g., in a plan view), the pixel defining pattern PDP may have a circular ring shape.

Although one pixel defining pattern PDP is illustrated to have, as an example, a circular ring shape in FIG. 9, the shape of the pixel defining pattern PDP is not necessarily limited thereto. For example, the shape of the pixel defining pattern PDP may be variously modified into shapes such as an angled ring shape, a ring shape including a straight line, a ring shape including a straight line and a curve, and an atypical ring shape.

The spacer PDS may be disposed in the first area DP-A1 and may be spaced apart from the pixel defining pattern PDP. The spacer PDS may also be disposed in the second area DP-A2 and the third area DP-A3. Within a unit surface area or the same surface area, the number of spacers PDS disposed in the third area DP-A3 may be greater than the number of spacers PDS disposed in the first area DP-A1. Within a unit surface area or the same surface area, the number of the spacers PDS disposed in the third area DP-A3 may be greater than the number of spacers PDS disposed in the second area DP-A2. For example, a density of the spacers PDS disposed in the third area DP-A3 may be higher than each of a density of the spacers disposed in the first area DP-A1 and a density of the spacers disposed in the second area DP-A2. In addition, in an embodiment of the inventive concept, the spacer PDS might not be disposed in the first area DP-A1. Alternatively, the spacer PDS might not be disposed in the first and second areas DP-A1 and DP-A2.

The spacer PDS may be thicker than the pixel defining pattern PDP. Alternatively, the height of the spacer PDS may be larger than the height of the pixel defining pattern PDP. The spacer PDS may be of a single-layer structure or a multilayer structure. The spacer PDS may be formed as the single-layer structure having the same material as the pixel defining pattern PDP, or the spacer PDS may include a first layer having the same material as the pixel defining pattern PDP and a second layer disposed on the first layer.

Both the pixel defining pattern PDP and the spacer PDS may include a black coloring agent. The black coloring agent may include a black dye or a black pigment. The black coloring agent may include carbon black, a metal such as chromium, or an oxide thereof. In an embodiment of the inventive concept, the pixel defining pattern PDP may include the black coloring agent, and the spacer PDS might not include the black coloring agent.

Figure 10A:
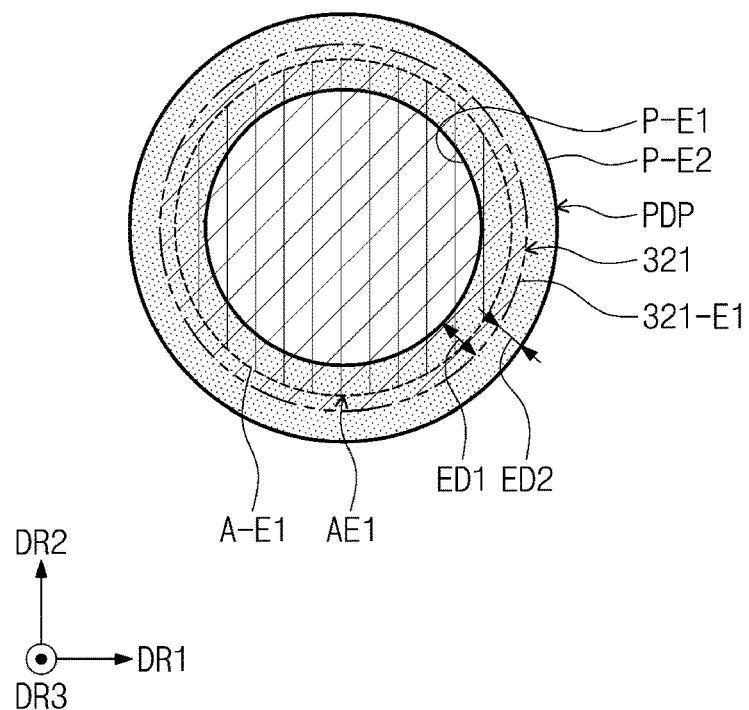
FIG. 10A is a plan view illustrating components of a display module according to an embodiment of the inventive concept.
Figure 10B:
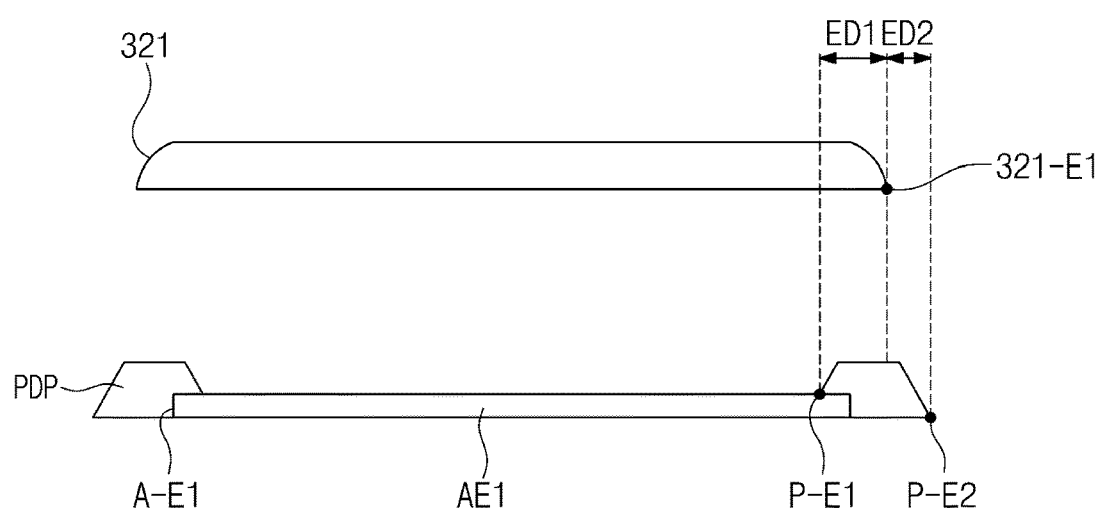
FIG. 10B is a cross-sectional view illustrating components of a display module according to an embodiment of the inventive concept.

FIG. 10A is a plan view illustrating components of a display module according to an embodiment of the inventive concept. FIG. 10B is a cross-sectional view illustrating components of a display module according to an embodiment of the inventive concept.

The first pixel electrode AE1, the pixel defining pattern PDP, and the first color filter 321 are illustrated in FIG. 10A and FIG. 10B.

The shape of the first pixel electrode AE1 when viewed in a plane (e.g., in a plan view) may be circular, elliptical, partially circular, or partially elliptical. In this case, diffraction of light passing through the transmissive area TA (see FIG. 7B) may be minimized.

In FIG. 10A, as an example, the first pixel electrode AE1 is illustrated as a circular shape, and an edge A-E1 of the first pixel electrode AE1 is illustrated as including a curve. The pixel defining pattern PDP may cover the edge A-E1 of the first pixel electrode AE1. The pixel defining pattern PDP may have a ring shape similar to the shape of the edge A-E1 of the first pixel electrode AE1.

The pixel defining pattern PDP may include a first edge P-E1 overlapping the first pixel electrode AE1 and a second edge P-E2 not overlapping the first pixel electrode AE1. The second edge P-E2 may surround the first edge P-E1. Each of the first edge P-E1 and the second edge P-E2 of the pixel defining pattern PDP may include a curve.

When viewed in the third direction DR3, an edge 321-E1 of the first color filter 321 may overlap the pixel defining pattern PDP. For example, the edge 321-E1 of the first color filter 321 may be disposed between the first edge P-E1 and the second edge P-E2 of the pixel defining pattern PDP.

It is desirable that all light emitted from the first light emitting layer EL1 (see FIG. 7B) and outputted to an external source passes through the first color filter 321. In addition, light outputted from the electronic module CM (see FIG. 2) or light incident on the electronic module CM (see FIG. 2) should not pass through the first color filter 321.

To satisfy the above-described condition, a first distance ED1 between the edge 321-E1 of the first color filter 321 and the first edge P-E1 of the pixel defining pattern PDP may be longer than a second distance ED2 between the edge 321-E1 of the first color filter 321 and the second edge P-E2 of the pixel defining pattern PDP. Accordingly, the display module DM (see FIG. 7B) may provide a high-quality image, and the quality of a signal obtained from the electronic module CM (see FIG. 2) or a signal outputted from the electronic module CM (see FIG. 2) may be increased.

For example, the first distance ED1 may be about twice or longer than the second distance ED2. However, this is a numerical value that may be changed according to a distance between the first color filter 321 and the pixel defining pattern PDP, and is not necessarily limited thereto. For example, when a distance between a bottom surface of the first color filter 321 and a top surface of the pixel defining pattern PDP is assumed to be about 6 micrometers, and a distance between the first edge P-E1 and the second edge P-E2 of the pixel defining pattern PDP is assumed to be about 8.85 micrometers, the first distance ED1 may be about 5.9 micrometers, and the second distance ED2 may be about 2.95 micrometers.

Figure 11A:
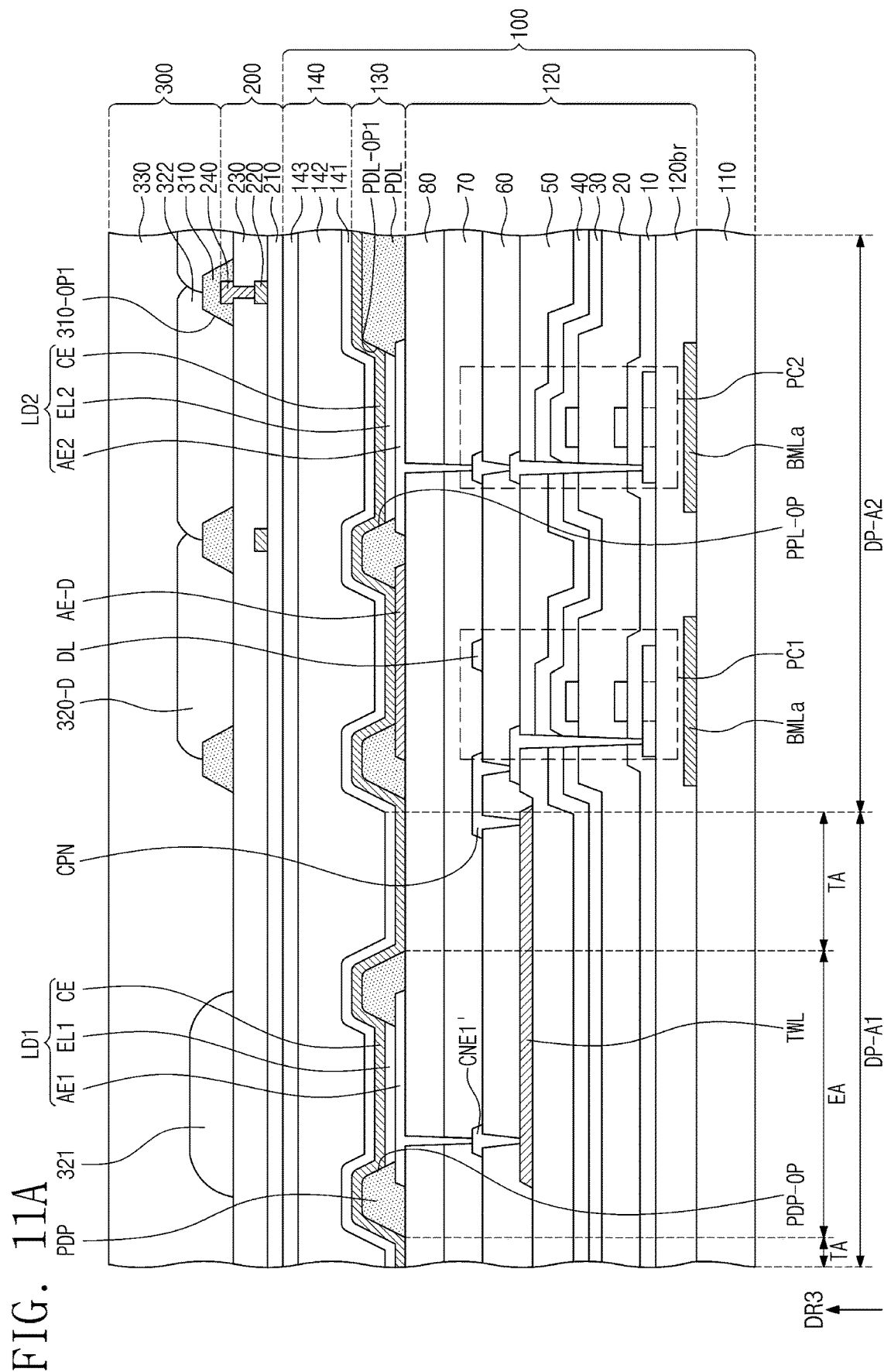
FIG. 11A is a cross-sectional view of a display module according to an embodiment of the inventive concept.
Figure 11B:
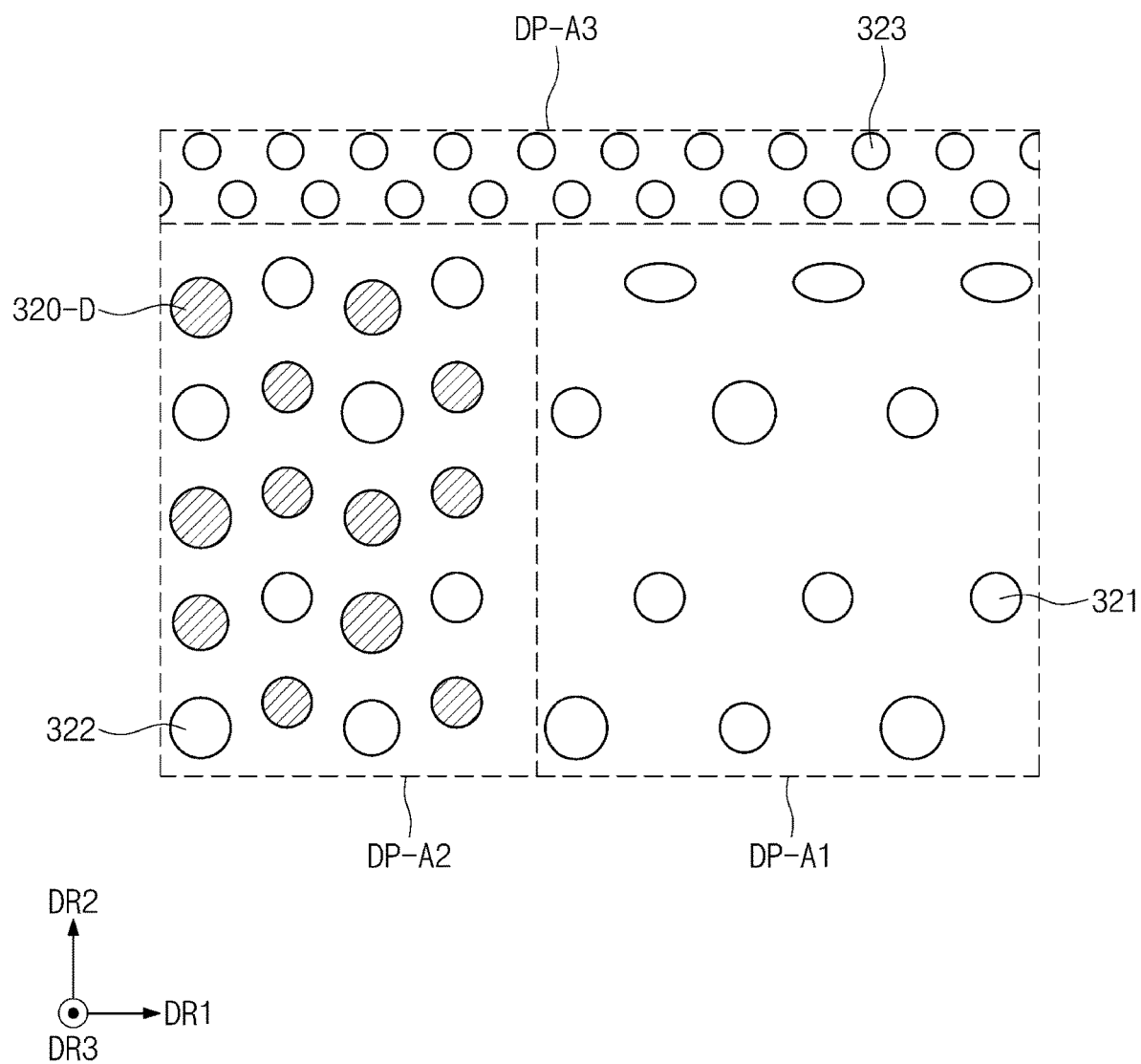
FIG. 11B is a plan view illustrating components of a display module according to an embodiment of the inventive concept.

FIG. 11A is a cross-sectional view of a display module according to an embodiment of the inventive concept. FIG. 11B is a plan view illustrating components of a display module according to an embodiment of the inventive concept. FIG. 11A is a cross-sectional view of a portion including a first area DP-A1 and a second area DP-A2.

Referring to FIG. 11A and FIG. 11B, a display panel 100 may further include dummy pixel electrodes AE-D disposed in the second area DP-A2, and an anti-reflection layer 300 may further include dummy color filters 320-D overlapping the second area DP-A2. FIG. 11B illustrates first color filters 321 disposed in the first area DP-A1, second color filters 322 and the dummy color filters 320-D disposed in the second area DP-A2, and third color filters 323 disposed in a third area DP-A3. In FIG. 11B, each of the dummy color filters 320-D is illustrated with hatched lines.

Each of the dummy pixel electrodes AE-D may be a pattern that is not electrically connected to a pixel circuit. The dummy color filter 320-D may overlap the dummy pixel electrode AE-D. The dummy color filter 320-D and the dummy pixel electrode AE-D may be provided to reduce a difference in visual perception between the second area DP-A2 and the third area DP-A3. For example, third pixels PX3 disposed in the third area DP-A3 may be more densely disposed than second pixels PX2 disposed in the second area DP-A2. The dummy color filter 320-D and the dummy pixel electrode AE-D may be provided in an empty area of the second area DP-A2, e.g., an area not emitting light in the second area DP-A2. Accordingly, a difference in reflectance between the second area DP-A2 and the third area DP-A3 may be reduced.

Each of the dummy pixel electrode AE-D and the dummy color filter 320-D may overlap a first pixel circuit PC1. However, the present inventive concept is not necessarily limited thereto. For example, the dummy pixel electrode AE-D and the dummy color filter 320-D may be arbitrarily provided in an area of the second area DP-A2 where a second light emitting element LD2 is not disposed. In an embodiment of the inventive concept, the dummy pixel electrode AE-D may be omitted.

The dummy color filters 320-D are provided to reduce the difference in reflectance between the second area DP-A2 and the third area DP-A3. Accordingly, the size and the arrangement of the dummy color filters 320-D illustrated in FIG. 11B are only an example and are not necessarily limited thereto. For example, in an embodiment of the inventive concept, the dummy color filters 320-D may be disposed in the second area DP-A2 so that the dummy color filters 320-D and the third color filters 323 have a similar size and a similar arrangement.

Figure 12:
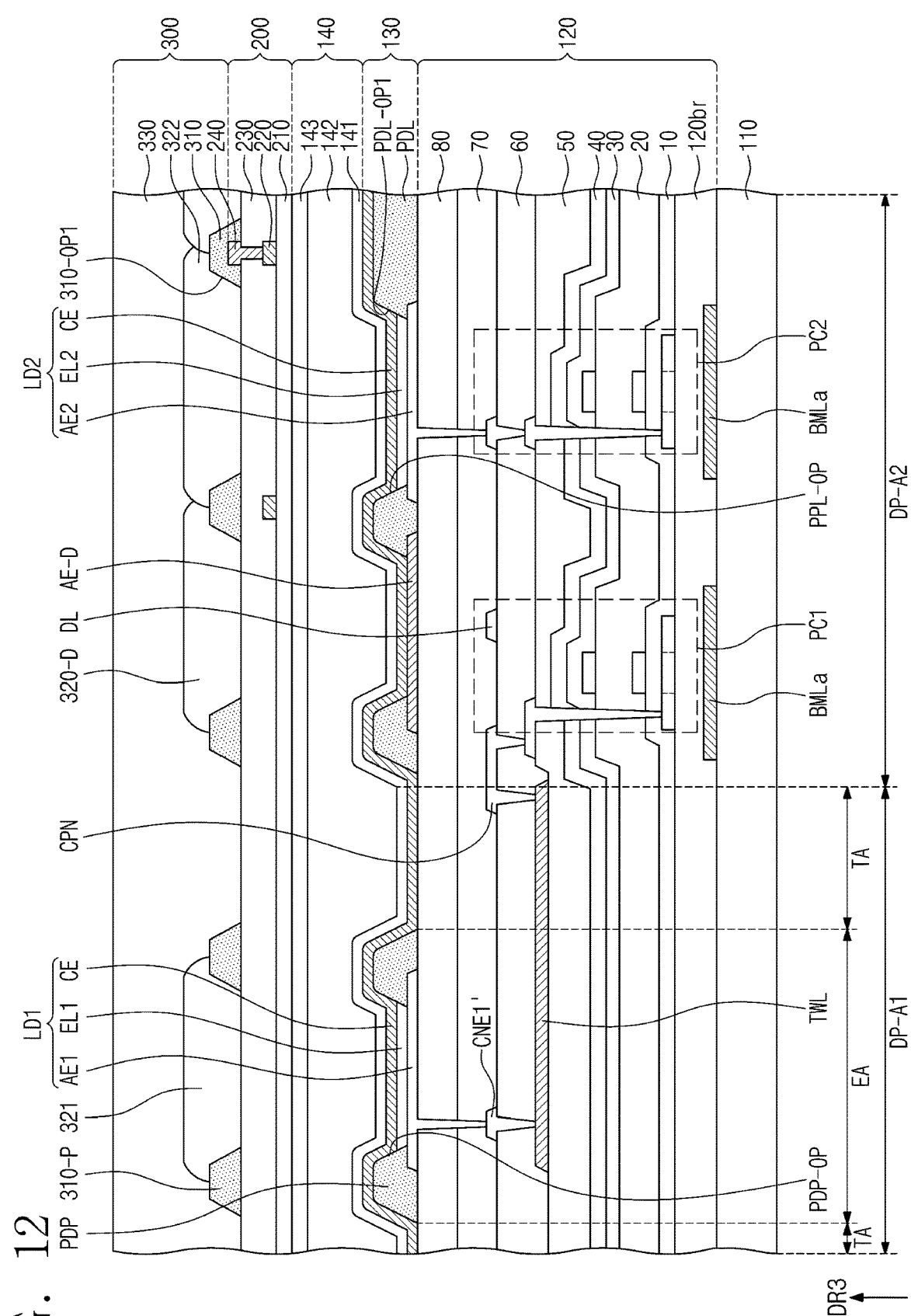
FIG. 12 is a cross-sectional view of a display module according to an embodiment of the inventive concept.
Figure 13:
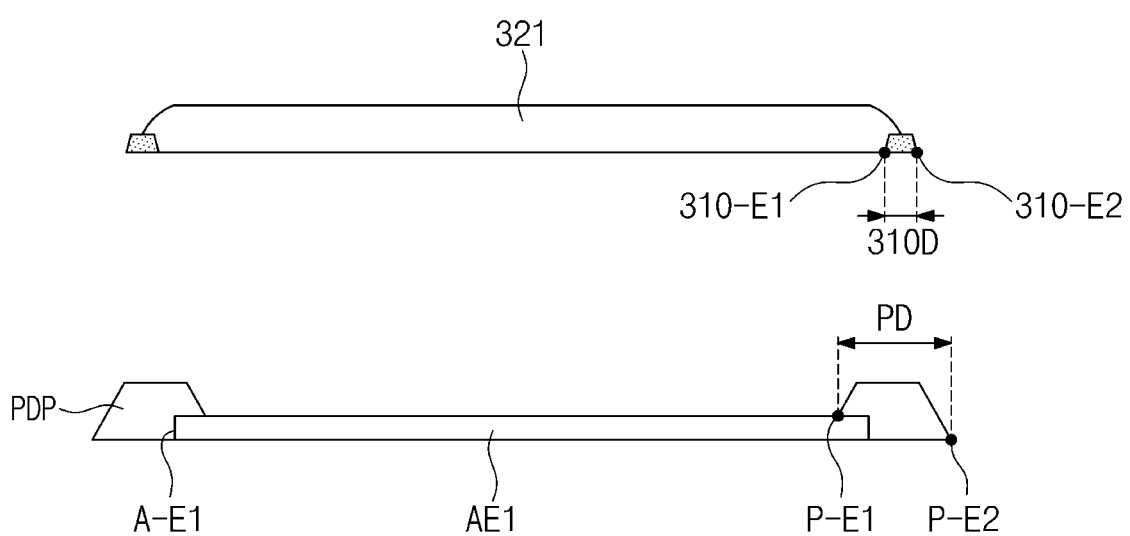
FIG. 13 is a cross-sectional view illustrating components of a display module according to an embodiment of the inventive concept.

FIG. 12 is a cross-sectional view of a display module according to an embodiment of the inventive concept. FIG. 13 is a cross-sectional view illustrating components of a display module according to an embodiment of the inventive concept.

Referring to FIG. 12 and FIG. 13, an anti-reflection layer 300 may further include a division pattern 310-P. The division pattern 310-P may overlap a first area DP-A1. The division pattern 310-P may have a ring shape including a first division edge 310-E1 and a second division edge 310-E2 surrounding the first division edge 310-E1. A first color filter 321 may cover an area surrounded by the first division edge 310-E1.

The first and second division edges 310-E1 and 310-E2 of the division pattern 310-P may overlap a pixel defining pattern PDP. For example, when viewed in a third direction DR3, the entirety of the division pattern 310-P may overlap the pixel defining pattern PDP.

A first distance PD between a first edge P-E1 and a second edge P-E2 of the pixel defining pattern PDP may be longer than a second distance 310D between the first division edge 310-E1 and the second division edge 310-E2. The first distance PD may be at least about twice the second distance 310D but is not necessarily limited thereto.

Figure 14:
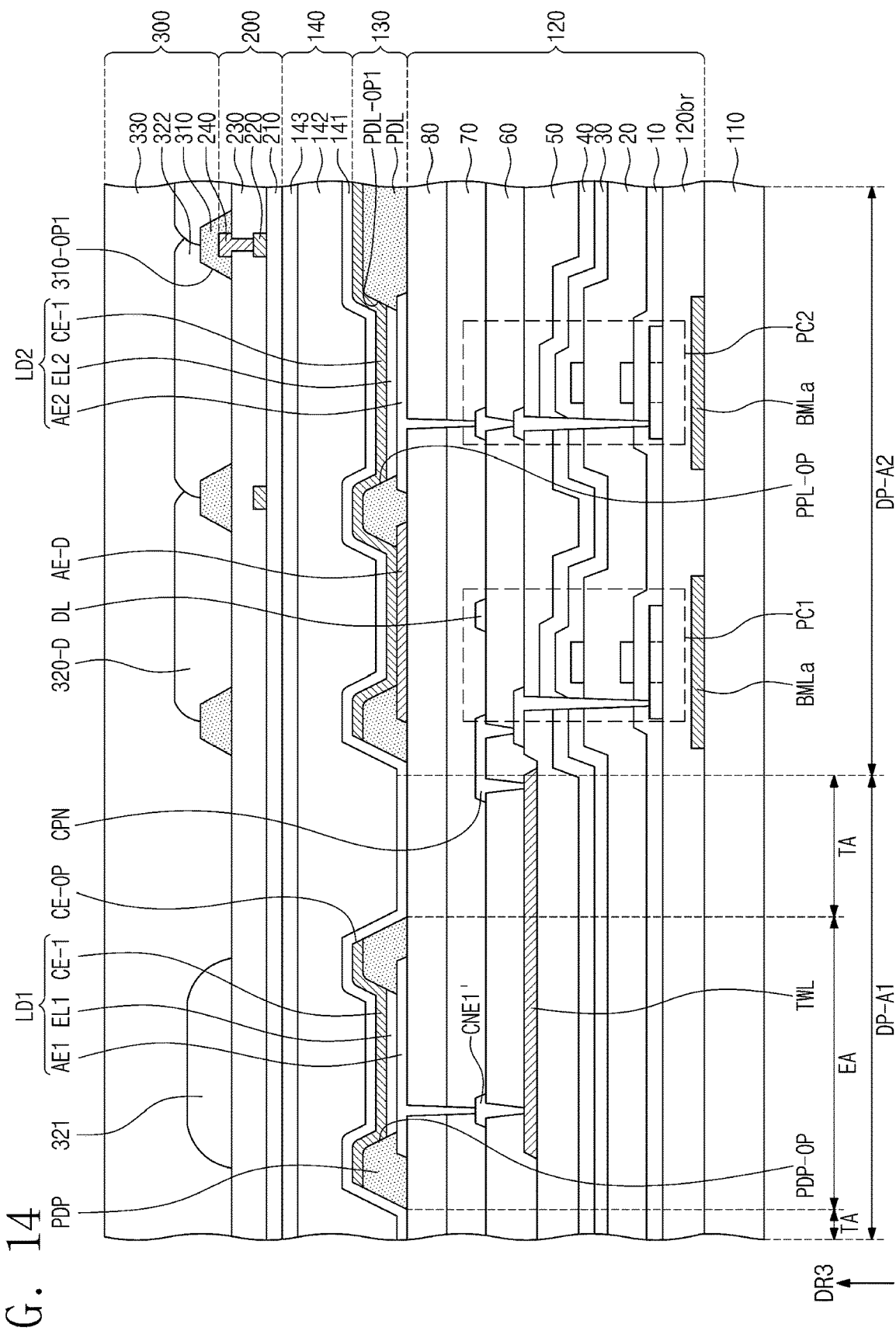
FIG. 14 is a cross-sectional view of a display module according to an embodiment of the inventive concept.
Figure 15:
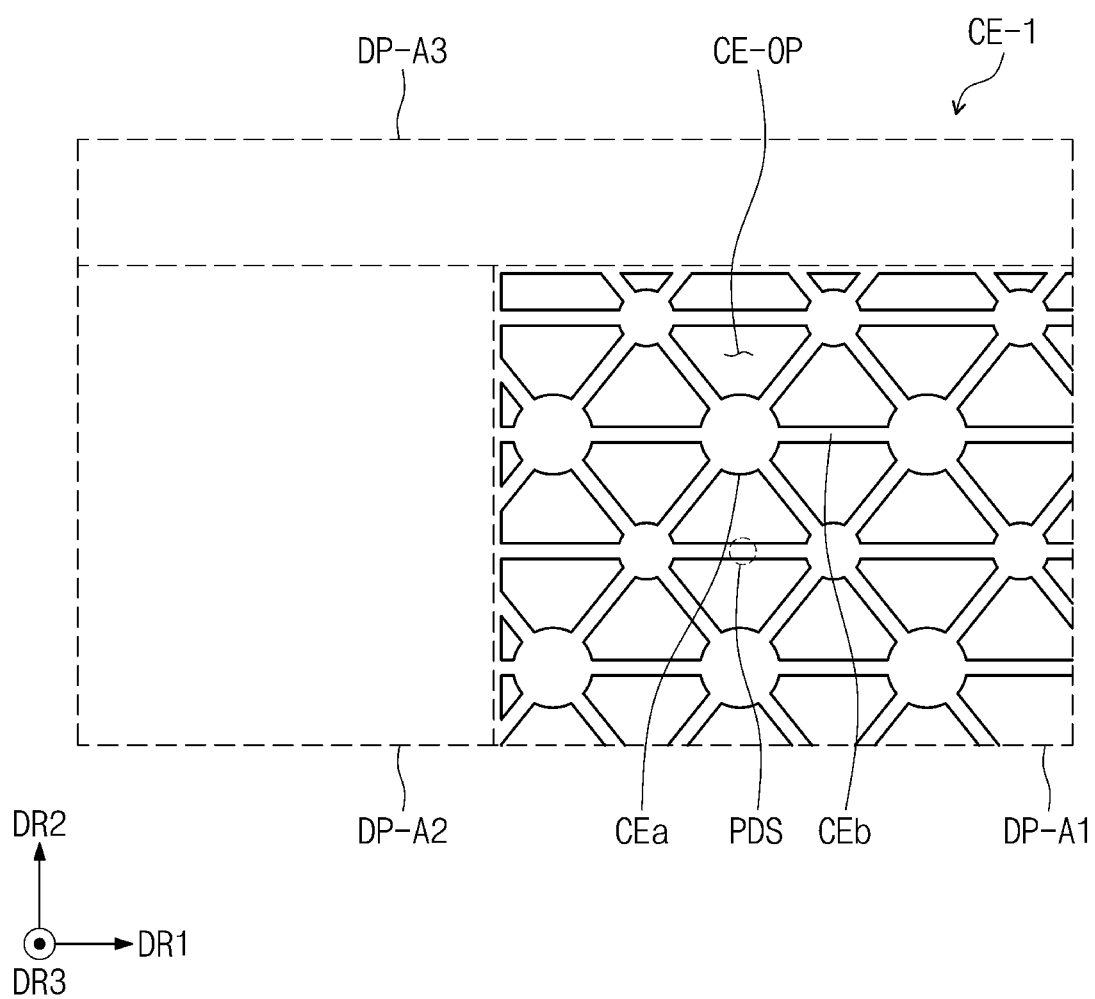
FIG. 15 is a plan view illustrating a portion of a common electrode according to an embodiment of the inventive concept.

FIG. 14 is a cross-sectional view of a display module according to an embodiment of the inventive concept. FIG. 15 is a plan view illustrating a portion of a common electrode according to an embodiment of the inventive concept. For example, FIG. 15 illustrates a portion of a common electrode CE-1 disposed in a portion corresponding to the area AA' of FIG. 4.

Referring to FIG. 14 and FIG. 15, a plurality of electrode openings CE-OP may be defined in a portion of the common electrode CE-1. The electrode openings CE-OP may be provided in a portion overlapping a transmissive area TA. As a portion of the common electrode CE-1 is removed from the portion overlapping the transmissive area TA, light transmittance of the transmissive area TA may be further increased.

The common electrode CE-1 may include first parts CEa overlapping a first pixel electrode AE1 and second parts CEb extending from the first parts CEa. The second parts CEb may be provided to electrically connect the first parts CEa spaced apart from each other. A spacer PDS may overlap one of the second parts CEb of the common electrode CE-1. Although, in FIG. 15, six second parts CEb are illustrated as an example to extend from each of the first parts CEa, an embodiment of the inventive concept is not necessarily limited thereto. The number of the second parts CEb is not necessarily limited as long as the second parts CEb connect the first parts CEa spaced apart from each other. As the number of the second parts CEb changes, the shapes of the electrode openings CE-OP may also change.

Figure 16:
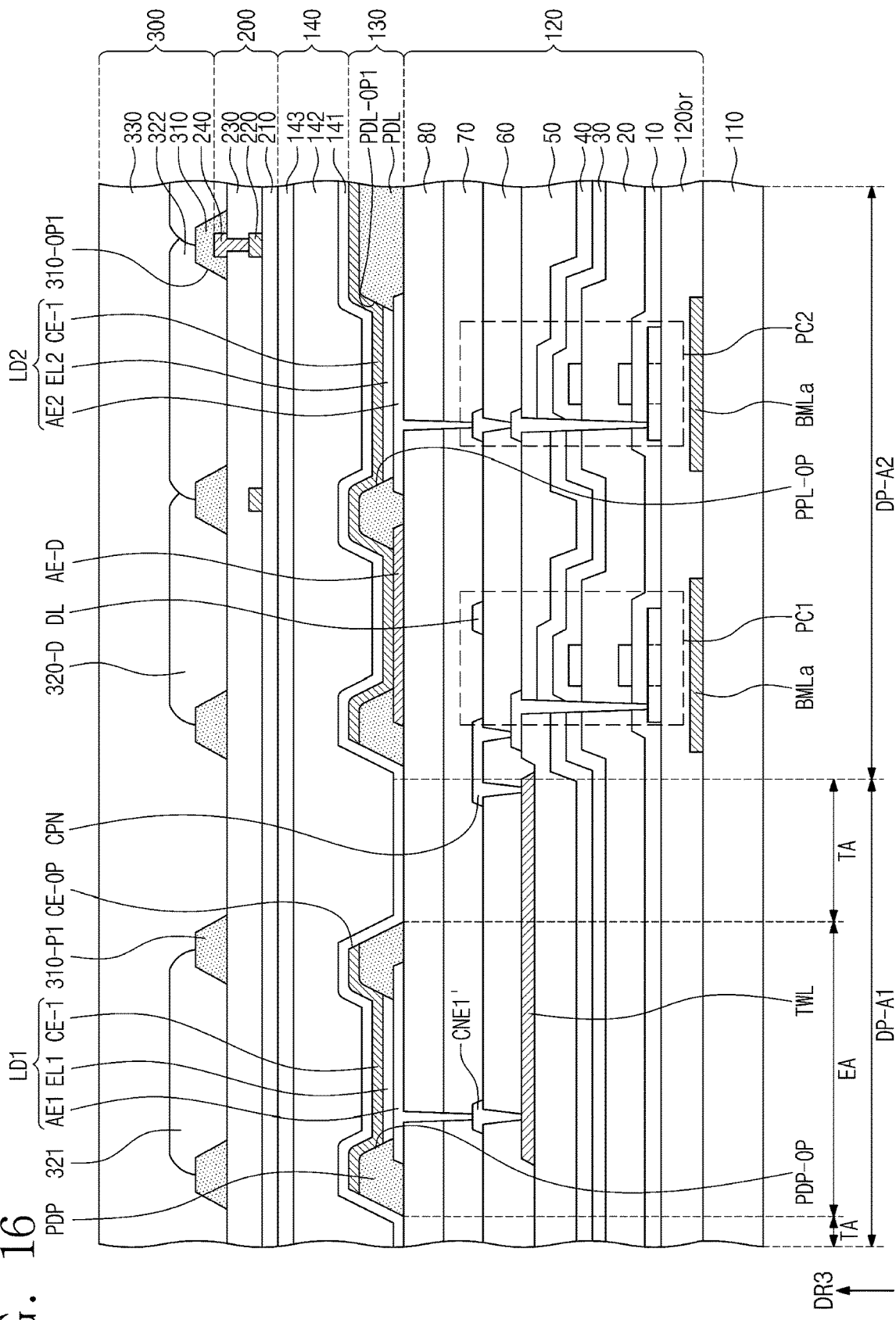
FIG. 16 is a cross-sectional view of a display module according to an embodiment of the inventive concept.
Figure 17:
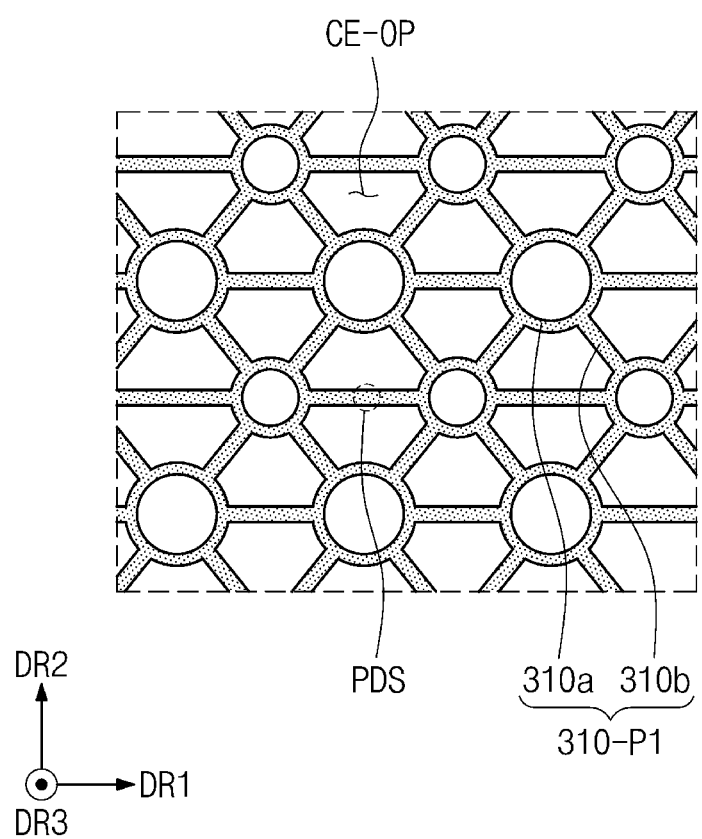
FIG. 17 is a plan view illustrating a portion of a division pattern according to an embodiment of the inventive concept.

FIG. 16 is a cross-sectional view of a display module according to an embodiment of the inventive concept. FIG. 17 is a plan view illustrating a portion of a division pattern according to an embodiment of the inventive concept. For example, FIG. 17 illustrates a portion of a division pattern 310-P1 overlapping a first area DP-A1. For better understanding, electrode openings CE-OP are illustrated together in FIG. 17.

The plurality of electrode openings CE-OP may be defined in a common electrode CE-1. The division pattern 310-P1 may overlap a portion of the common electrode CE-1. The division pattern 310-P1 may reduce reflection of external light from the common electrode CE-1.

In the first area DP-A1, the shape of the division pattern 310-P1 may be similar to the shape of the common electrode CE-1. For example, the division pattern 310-P1 may include first division parts 310a each having a ring shape corresponding to the shape of an edge of each of first parts CEa and second division parts 310b each having a shape corresponding to the shape of each of second parts CEb. The second division parts 310b may be referred to as a connection pattern. A spacer PDS may overlap one of the second division parts 310b of the division pattern 310-P1.

The first division parts 310a and the second division parts 310b may be connected to each other. In an embodiment of the inventive concept, at least some of the second division parts 310b may be omitted to increase the transmittance of light of a transmissive area TA.

Figure 18:
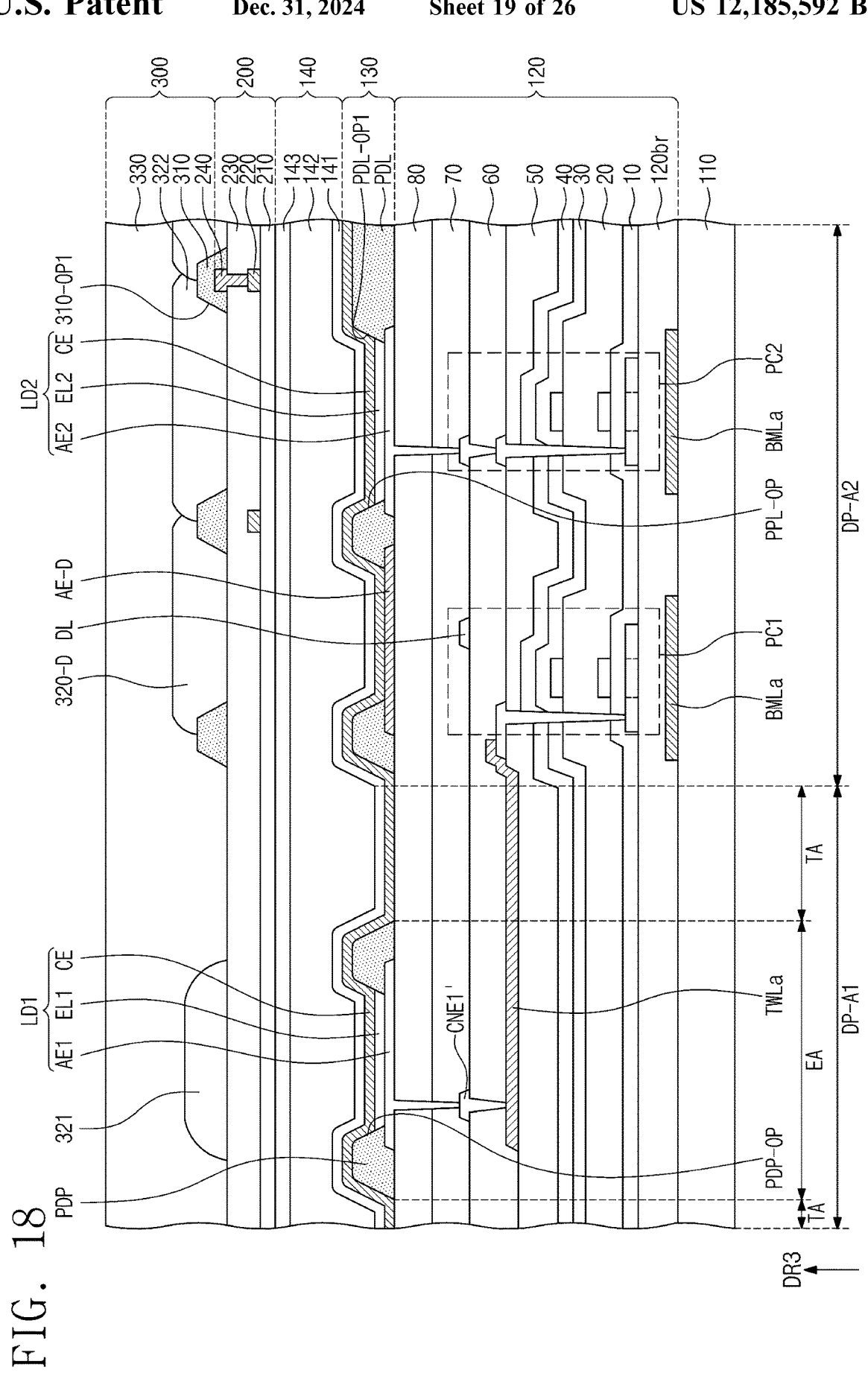
FIG. 18 is a cross-sectional view of a display module according to an embodiment of the inventive concept.

FIG. 18 is a cross-sectional view of a display module according to an embodiment of the inventive concept.

Referring to FIG. 18, a connection line TWLa connecting a first light emitting element LD1 and a first pixel circuit PC1 may be disposed between a fifth insulating layer 50 and a sixth insulating layer 60. The connection line TWLa may include a light-transmissive material.

Compared with the connection line TWL illustrated in FIG. 7B, the connection line TWLa illustrated in FIG. 18 may be directly connected to the first pixel circuit PC1 without going via the connection bridge CPN (see FIG. 7B).

Figure 19:
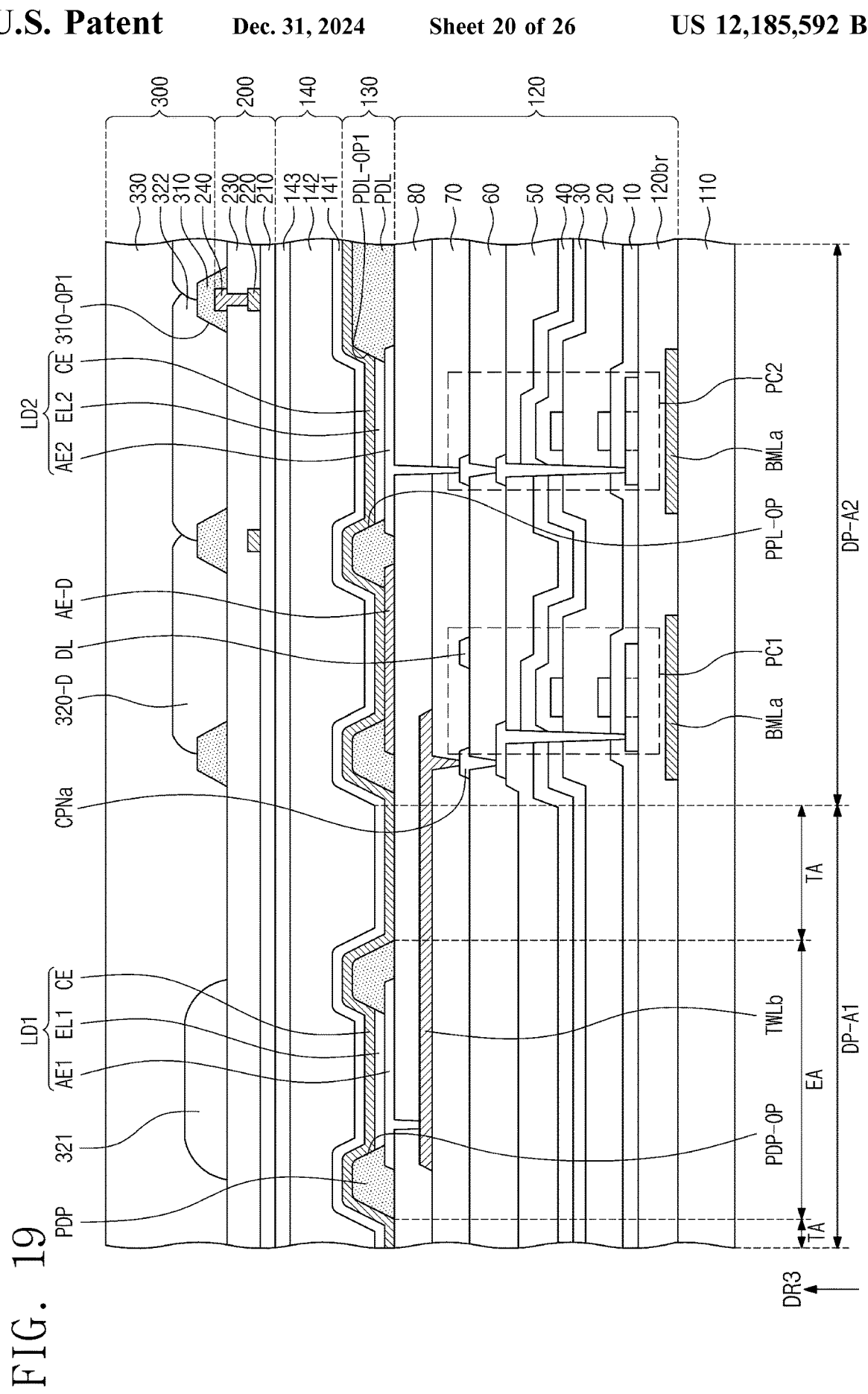
FIG. 19 is a cross-sectional view of a display module according to an embodiment of the inventive concept.

FIG. 19 is a cross-sectional view of a display module according to an embodiment of the inventive concept.

Referring to FIG. 19, a connection line TWLb connecting a first light emitting element LD1 and a first pixel circuit PC1 may be disposed between a seventh insulating layer 70 and an eighth insulating layer 80. The connection line TWLb may include a light-transmissive material.

The connection line TWLb may be electrically connected to the first pixel circuit PC1 through a connection electrode CPNa. The connection electrode CPNa may be disposed between a sixth insulating layer 60 and the seventh insulating layer 70. In an embodiment of the inventive concept, the connection electrode CPNa may be omitted, and in this case, the connection line TWLb may be directly connected to the first pixel circuit PC1.

Each of connection lines included in a display panel 100 may include the connection line TWL described above with reference to FIG. 7B, the connection line TWLa described with reference to FIG. 18, or the connection line TWLb described with reference to FIG. 19. The connection lines need only include a light-transmissive material because the connection lines overlap the transmissive area TA, and the position of each of the connection lines is not necessarily limited to a specific embodiment.

Figure 20:
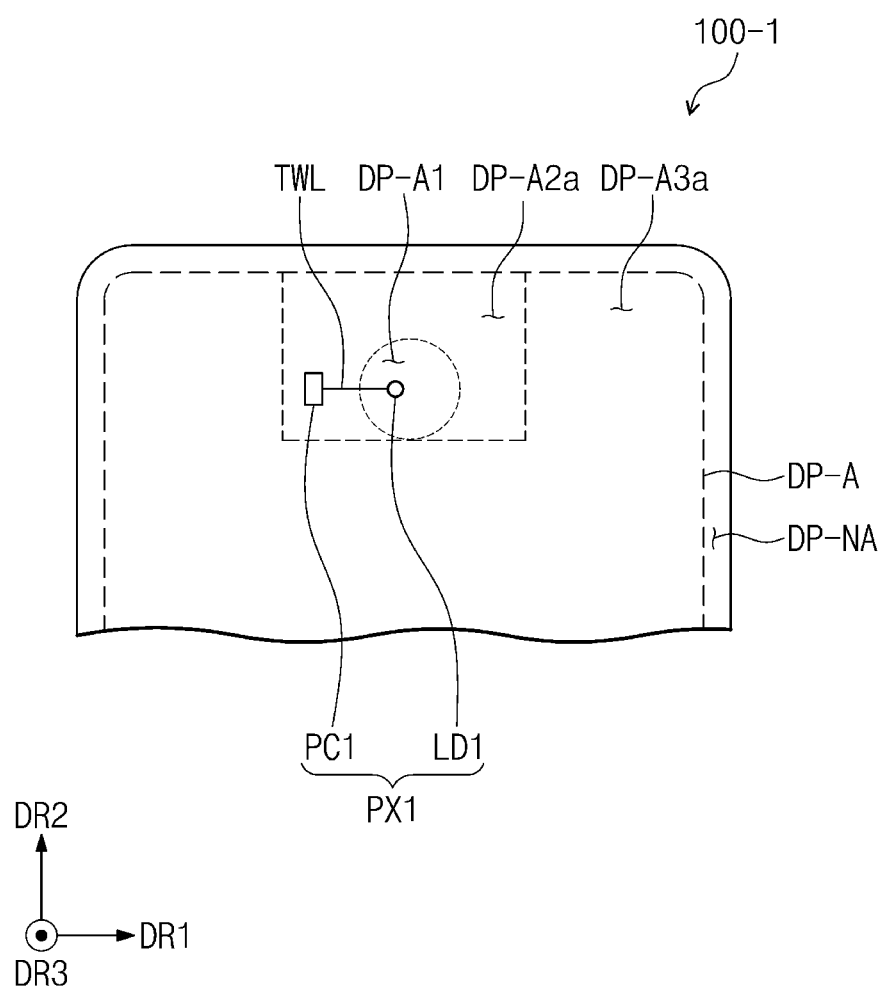
FIG. 20 is a plan view illustrating a portion of a display panel according to an embodiment of the inventive concept.

FIG. 20 is a plan view illustrating a portion of a display panel according to an embodiment of the inventive concept.

Referring to FIG. 20, a display area DP-A of a display panel 100-1 may include a first area DP-A1, a second area DP-A2a, and a third area DP-A3a. The second area DP-A2a may surround at least a portion of the first area DP-A1. The second area DP-A2a may be in contact with a peripheral area DP-NA. The third area DP-A3a may surround a portion of the second area DP-A2a.

A surface area of the second area DP-A2a illustrated in FIG. 20 may be larger than a surface area of the second area DP-A2 illustrated in FIG. 4. According to the embodiment illustrated in FIG. 4, as the surface area of the second area DP-A2 is minimized, a surface area of an area having a low resolution may be minimized. According to the embodiment illustrated in FIG. 20, as the surface area of the second area DP-A2a expands, a surface area of an area, in which a first pixel circuit PC1 connected to a first light emitting element LD1 disposed in the first area DP-A1 is to be disposed, may increase, thereby increasing the degree of freedom in design.

Figure 21:
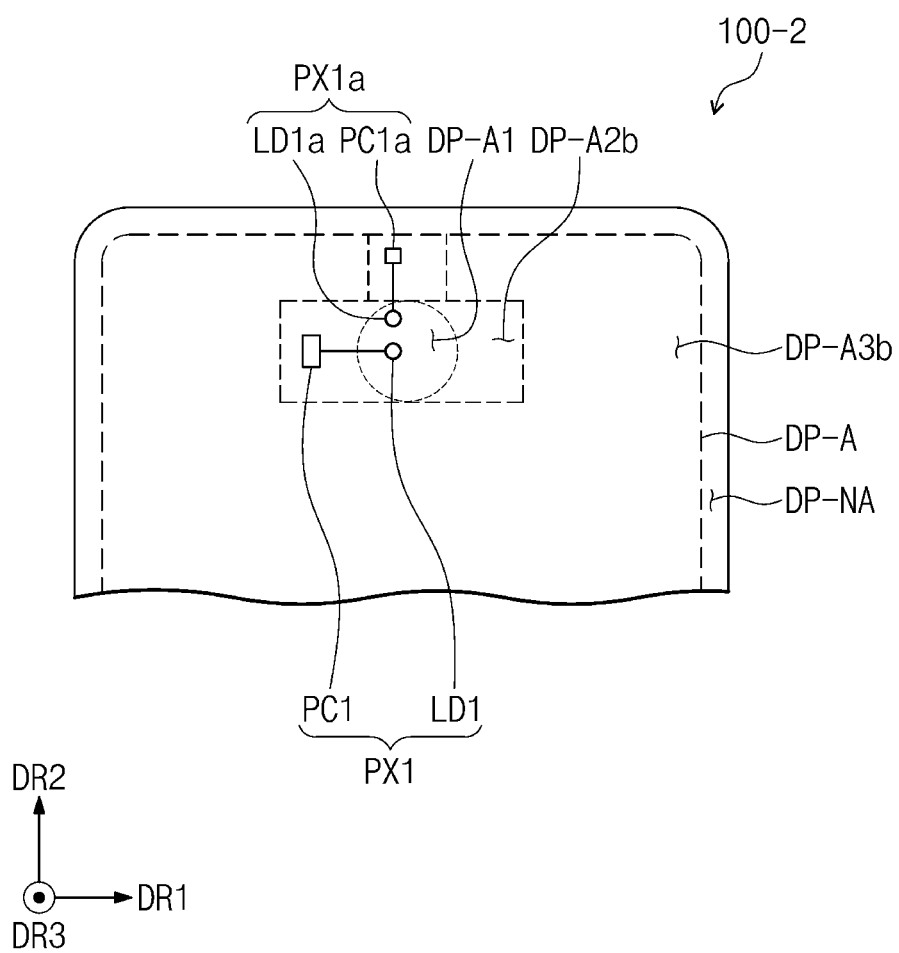
FIG. 21 is a plan view illustrating a portion of a display panel according to an embodiment of the inventive concept.

FIG. 21 is a plan view illustrating a portion of a display panel 100-2 according to an embodiment of the inventive concept.

Referring to FIG. 21, a display area DP-A of the display panel 100-2 may include a first area DP-A1, a second area DP-A2b, and a third area DP-A3b. The display panel 100-2 may further include a first pixel PX1a including a first light emitting element LD1a disposed in the first area DP-A1 and a first pixel circuit PC1a for driving the first light emitting element LD1a. The first pixel circuit PC1a may be spaced apart from the first light emitting element LD1a in a second direction DR2. The first pixel circuit PC1a may be disposed in a portion of the second area DP-A2b between a peripheral area DP-NA and the first area DP-A1.

The width of the second area DP-A2b in a first direction DR1 may vary depending on the location. For example, when compared with the second area DP-A2a illustrated in FIG. 20, the portion of the second area DP-A2b between the first area DP-A1 and the peripheral area DP-NA may be formed to be narrower.

When compared with FIG. 20, as a surface area of the second area DP-A2b having a relatively lower resolution compared with the third area DP-A3b is reduced, the display quality of the entirety of the display area DP-A may be increased.

Figure 22:
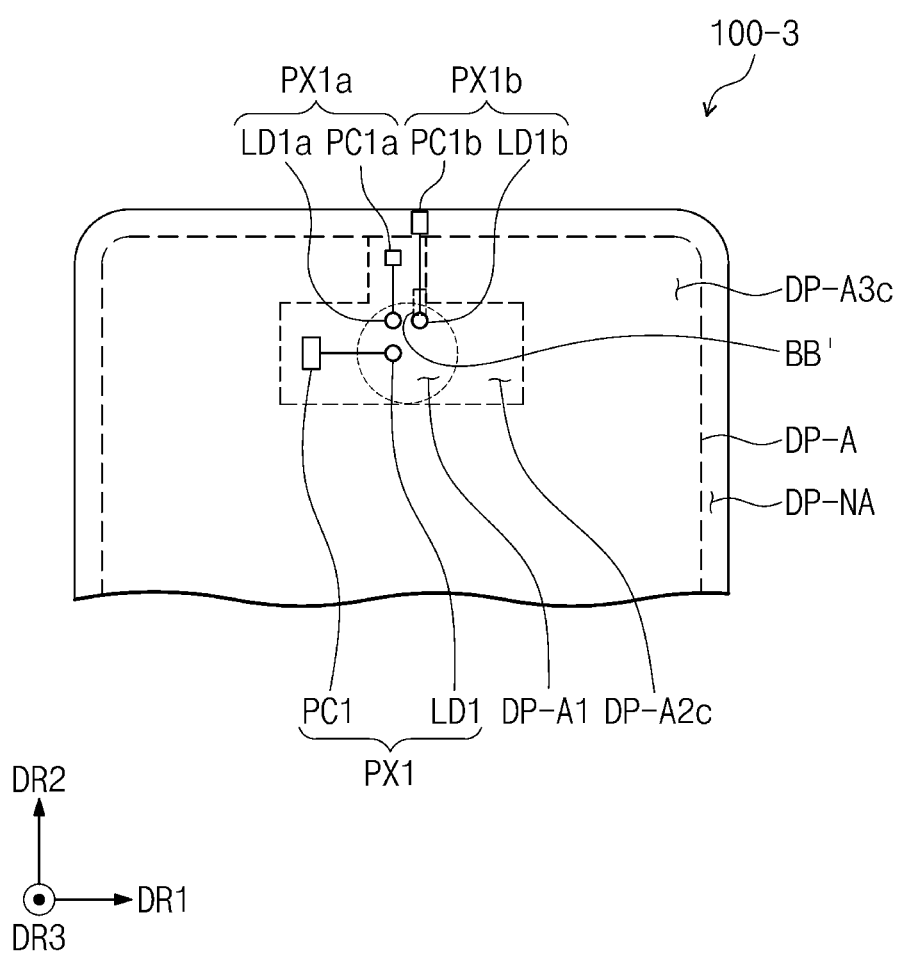
FIG. 22 is a plan view illustrating a portion of a display panel according to an embodiment of the inventive concept.

FIG. 22 is a plan view illustrating a portion of a display panel according to an embodiment of the inventive concept.

Referring to FIG. 22, a display area DP-A of a display panel 100-3 may include a first area DP-A1, a second area DP-A2c, and a third area DP-A3c.

The display panel 100-3 may further include a first pixel PX1b including a first light emitting element LD1b disposed in the first area DP-A1 and a first pixel circuit PC1b for driving the first light emitting element LD1b. The first pixel circuit PC1b may be disposed in a peripheral area DP-NA.

For example, as the first pixel circuit PC1b is disposed in the peripheral area DP-NA, a surface area of the second area DP-A2c may be reduced. Accordingly, a surface area of the third area DP-A3c having a relatively higher resolution is increased, and thus the display quality of the entirety of the display area DP-A may be increased.

In an embodiment of the inventive concept, all of first pixel circuits PC1 and PC1a and the first pixel circuit PC1b respectively connected to first light emitting elements LD1 and LD1a and the first light emitting element LD1b which are disposed in the first area DP-A1 may be disposed in the peripheral area DP-NA. In this case, the second area DP-A2c may be omitted.

Figure 23:
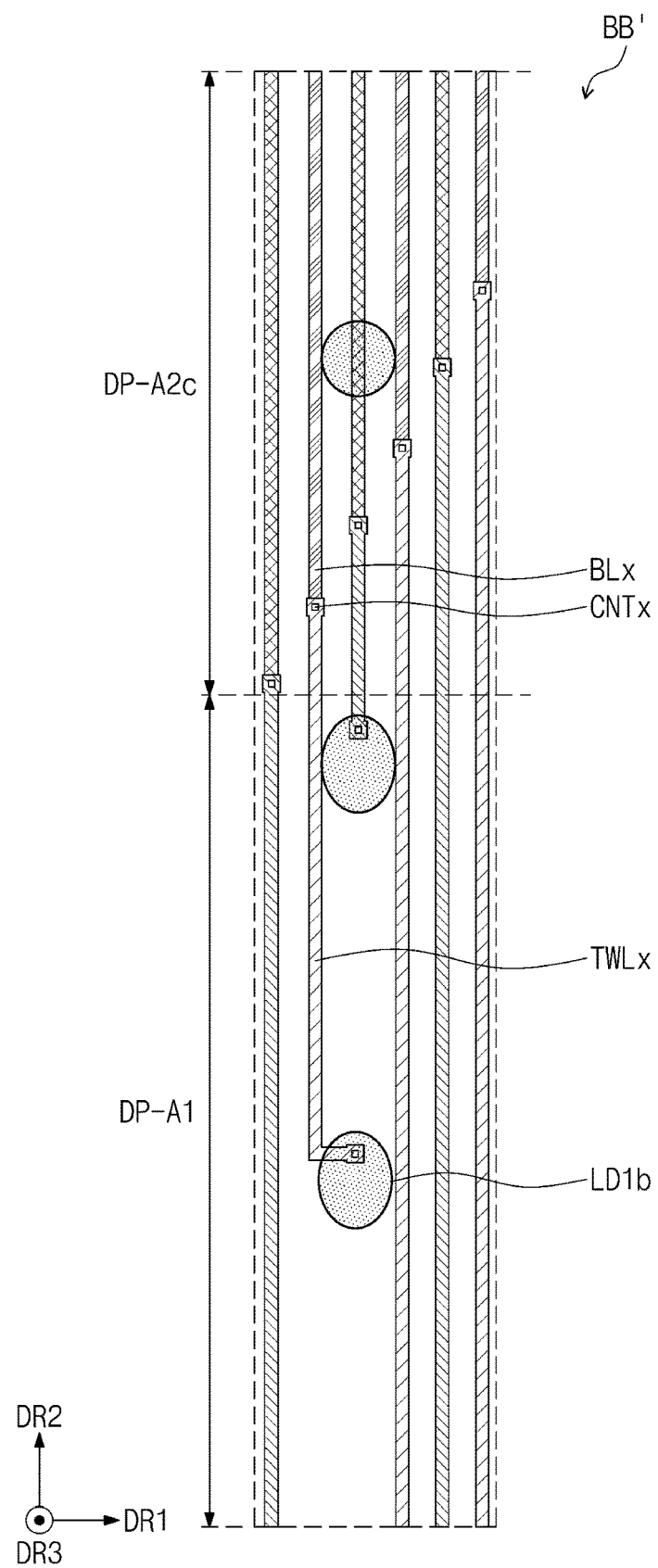
FIG. 23 is a plan view of components of a display panel illustrating the area BB' of FIG. 22.

FIG. 23 is a plan view of components of a display panel enlarging and illustrating the area BB' of FIG. 22.

Referring to FIG. 22 and FIG. 23, a connection line TWLx connected to the first light emitting element LD1b and the first pixel circuit PC1b is illustrated. The connection line TWLx may include a light-transmissive material. The connection line TWLx may be connected to a conductive line BLx.

The conductive line BLx may be a line disposed in the second area DP-A2c. Because a transmissive area is not provided in the second area DP-A2c, a composition of the conductive line BLx may be of various materials. The conductive line BLx may include a material having a lower electrical resistance than that of a material of the connection line TWLx. For example, the conductive line BLx may include titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), and the like, but is not necessarily limited thereto.

Although the conductive line BLx may be disposed between a fifth insulating layer 50 (see FIG. 7A) and a sixth insulating layer 60 (see FIG. 7A) or disposed between the sixth insulating layer 60 (see FIG. 7A) and a seventh insulating layer 70 (see FIG. 7A), the conductive line BLx is not necessarily limited thereto.

Figure 24A:
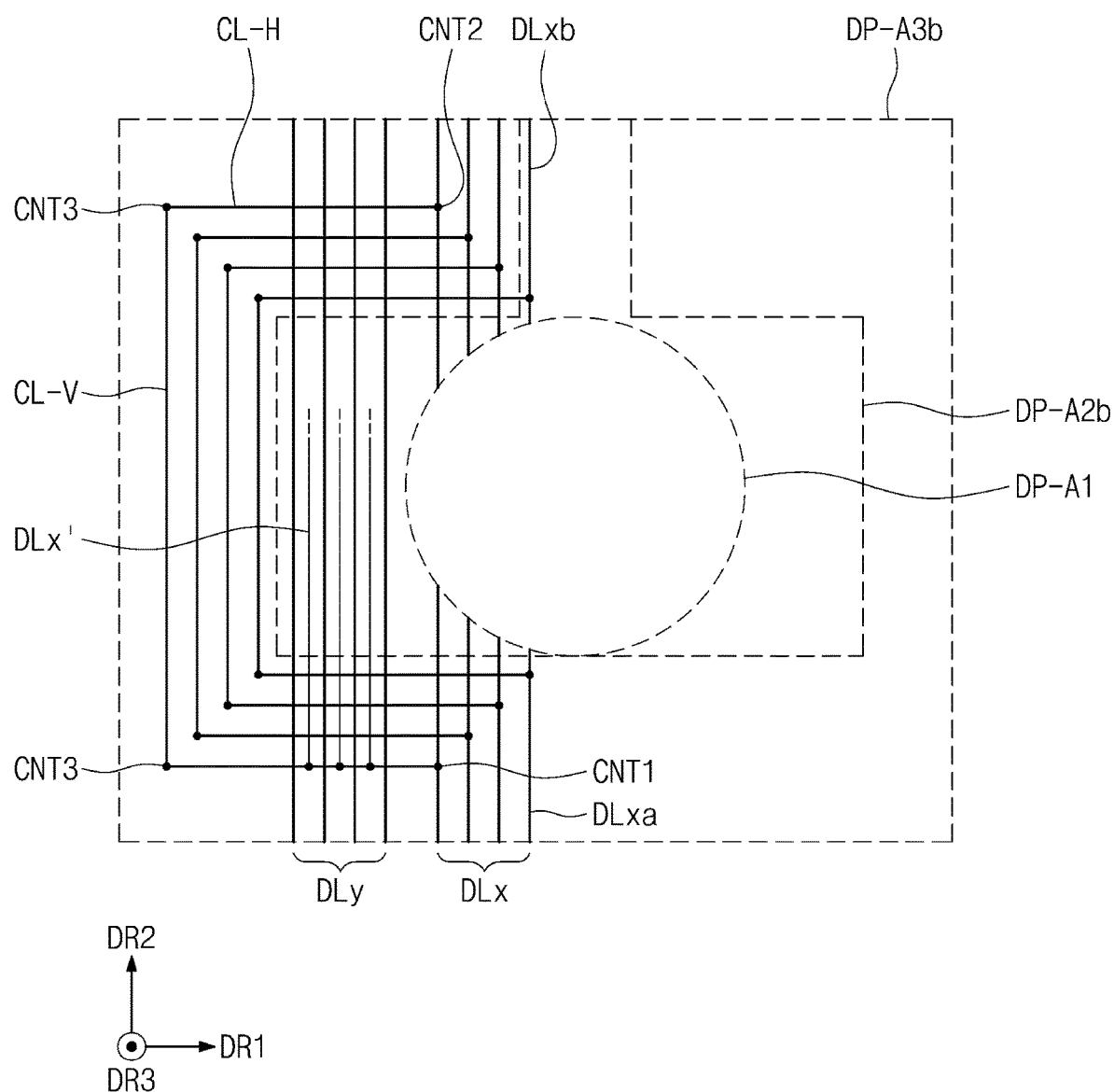
FIG. 24A is an enlarged plan view illustrating a portion of a display panel according to an embodiment of the inventive concept.
Figure 24B:
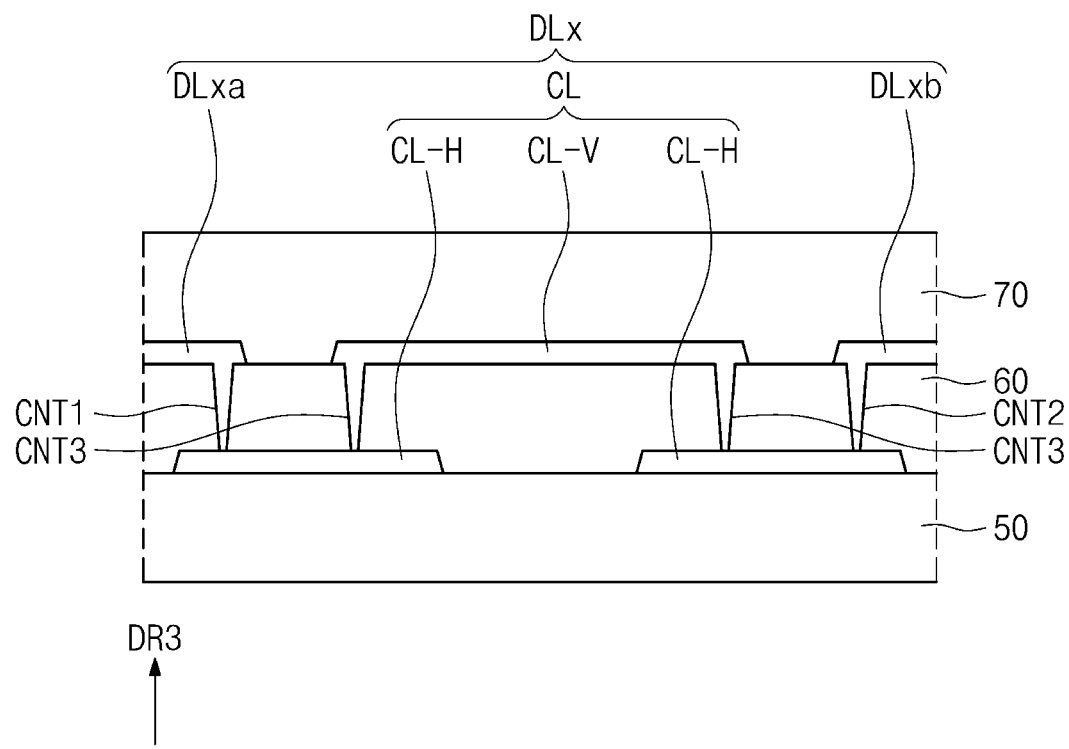
FIG. 24B is a cross-sectional view schematically illustrating a cross section of the first data line illustrated in FIG. 24A.

FIG. 24A is an enlarged plan view illustrating a portion of a display panel according to an embodiment of the inventive concept. FIG. 24B is a cross-sectional view schematically illustrating a cross section of the first data line illustrated in FIG. 24A.

Referring to FIG. 21, FIG. 24A, and FIG. 24B, a plurality of data lines DLx and DLy are illustrated.

The plurality of data lines DLx and Dly may include first data lines DLx and second data lines Dly. The first data lines DLx may extend toward the first area DP-A1 and may bypass the first area DP-A1 so that the first data lines DLx do not overlap the first area DP-A1. Accordingly, the transmittance of light of the first area DP-A1 may be further increased. Each of the second data lines Dly may extend in the second direction DR2.

Each of the first data lines DLx may include a first partial line Dlxa, a second partial line DLxb, and a transmission line CL. The first partial line Dlxa and the second partial line DLxb may be spaced apart from each other with the first area DP-A1 therebetween. Each of the first partial line Dlxa and the second partial line DLxb may extend in the second direction DR2, and the first partial line Dlxa and the second partial line DLxb may be spaced apart in the second direction DR2.

The transmission line CL may be electrically connected to the first partial line Dlxa and the second partial line DLxb. The transmission line CL may transmit, to the second partial line DLxb, a data signal inputted through the first partial line Dlxa. One end of the transmission line CL may be connected to the first partial line Dlxa through a first contact hole CNT1, and the other end of the transmission line CL may be connected to the second partial line DLxb through a second contact hole CNT2.

The transmission line CL may include a first transmission line CL-H extending in the first direction DR1 and a second transmission line CL-V extending in the second direction DR2. The first transmission line CL-H may be disposed on a layer different from layers on which the first partial line Dlxa and the second partial line DLxb are disposed. The first transmission line CL-H and the second transmission line CL-V may be disposed on different layers. The first transmission line CL-H and the second transmission line CL-V may be connected to each other through a third contact hole CNT3.

A data transmission line DLx' for transmitting a data signal to a first pixel circuit PC1 disposed in the second area DP-A2b may be connected to the transmission line CL. The data transmission line DLx' may extend in the second direction DR2 and may be connected to the first transmission line CL-H. Accordingly, the data signal transmitted through the first partial line Dlxa may be provided to the data transmission line DLx'.

The first transmission line CL-H may be disposed between a fifth insulating layer 50 and a sixth insulating layer 60, and the second transmission line CL-V, the first partial line Dlxa, and the second partial line DLxb may be disposed between the sixth insulating layer 60 and a seventh insulating layer 70.

As described above, the pixel defining pattern may be disposed in the first area of the display module, and the pixel defining film may be disposed in the second area of the display module which is different from the first area. The pixel defining pattern may have a shape corresponding to the edge of the pixel electrode and may overlap the edge of the pixel electrode. For example, the pixel defining pattern may have a ring shape. All of light emitted from the light emitting layer of the pixel and outputted to an external source may pass through the color filter disposed on the pixel electrode or may be absorbed in the pixel defining pattern, and light outputted from the electronic module or light incident on the electronic module might not pass through the color filter. Accordingly, the display module may provide a high-quality image, and the quality of a signal obtained from the electronic module or outputted by the electronic module may be increased.

In addition, the anti-reflection layer may further include the dummy color filter disposed in a portion overlapping an area where the light emitting element is not disposed. In this case, a difference in visual perception between two areas having different resolutions may be reduced. Accordingly, a boundary between the two areas having the different resolutions might be unrecognizable or difficult to recognize.

Although exemplary embodiments of the inventive concept have been described herein, it is understood that various changes and modifications can be made by those skilled in the art within the spirit and scope of the inventive concept defined.

What is claimed is:

1. An electronic device, comprising
a display panel comprising a first area, a second area adjacent to the first area, and a third area surrounding at least a portion of the second area,
wherein the display panel further comprises:
a first pixel including a first light emitting element disposed in the first area and a first pixel circuit, disposed in the second area, and configured to drive the first light emitting element, wherein the first light emitting element includes a first pixel electrode;
a second pixel including a second light emitting element disposed in the second area and a second pixel circuit, disposed in the second area, and configured to drive the second light emitting element, wherein the second light emitting element includes a second pixel electrode;
a third pixel including a third light emitting element disposed in the third area and a third pixel circuit, disposed in the third area, and configured to drive the third light emitting element, wherein the third light emitting element includes a third pixel electrode; and
a pixel defining pattern disposed on the first pixel electrode and having a ring shape.

2. The electronic device of claim 1, wherein the display panel further comprises a pixel defining film covering the second pixel electrode and the third pixel electrode, the pixel defining film includes a first opening exposing a portion of the second pixel electrode and a second opening exposing a portion of the third pixel electrode, and
wherein the pixel defining film comprises a same material as the pixel defining pattern.

3. The electronic device of claim 1, further comprising an anti-reflection layer disposed on the display panel, the anti-reflection layer including a first color filter overlapping the first pixel electrode, a second color filter overlapping the second pixel electrode, and a third color filter overlapping the third pixel electrode.

4. The electronic device of claim 3, wherein an edge of the first color filter overlaps the pixel defining pattern.

5. The electronic device of claim 4, wherein the pixel defining pattern comprises a first edge overlapping the first pixel electrode and a second edge surrounding the first edge, and
wherein a distance between the edge of the first color filter and the first edge is longer than a distance between the edge of the first color filter and the second edge.

6. The electronic device of claim 5, wherein an edge of the first pixel electrode is curved and the first and second edges of the pixel defining pattern are curved.

7. The electronic device of claim 3, wherein the anti-reflection layer further comprises a division layer overlapping the second and third areas and not overlapping the first area, and
wherein a plurality of openings is defined in the division layer, the second color filter covers any one of the plurality of openings, and the third color filter covers another one of the plurality of openings.

8. The electronic device of claim 7, wherein the anti-reflection layer further comprises a division pattern overlapping the first area, and
wherein the division pattern has a ring shape including a first division edge and a second division edge surrounding the first division edge, and the first color filter covers an area surrounded by the first division edge.

9. The electronic device of claim 8, wherein the pixel defining pattern comprises a first edge overlapping the first pixel electrode and a second edge surrounding the first edge, and
wherein a distance between the first edge and the second edge is longer than a distance between the first division edge and the second division edge.

10. The electronic device of claim 3, wherein the display panel further comprises a common electrode included in each of the first light emitting element, the second light emitting element, and the third light emitting element, and
wherein a plurality of electrode openings is defined in a portion of the common electrode disposed in the first area.

11. The electronic device of claim 10, wherein the anti-reflection layer further comprises a connection pattern overlapping the first area and the common electrode, and the connection pattern is spaced apart from the plurality of electrode openings.

12. The electronic device of claim 3, wherein the anti-reflection layer further comprises a dummy color filter overlapping the second area.

13. The electronic device of claim 12, wherein the display panel further comprises a dummy pixel electrode disposed in the second area and overlapping the dummy color filter.

14. The electronic device of claim 13, wherein the dummy pixel electrode and the dummy color filter each overlap the first pixel circuit.

15. The electronic device of claim 1, wherein the display panel further comprises a connection line electrically connecting the first light emitting element and the first pixel circuit to each other, and
wherein the connection line comprises a light-transmissive material.

16. The electronic device of claim 15, wherein the first area comprises a transmissive area and an element area, and
wherein the first pixel electrode overlaps the element area, and at least a portion of the connection line overlaps the transmissive area.

17. The electronic device of claim 1, further comprising an electronic module disposed below the first area.

18. The electronic device of claim 1, wherein a surface area of the first pixel electrode is larger than a surface area of the third pixel electrode.

19. The electronic device of claim 1, wherein the first light emitting element is provided in plural, and the third light emitting element is provided in plural, and
wherein a distance between two first light emitting elements closest to each other among the plurality of first light emitting elements is longer than a distance between two third light emitting elements closest to each other among the plurality of third light emitting elements.

20. The electronic device of claim 1, wherein the first light emitting element is provided in plural, and the pixel defining pattern is provided in plural, and
wherein the plurality of pixel defining patterns correspond one-to-one to the plurality of first light emitting elements and partially overlap the plurality of first light emitting elements, and each of the plurality of pixel defining patterns are spaced apart from each other.

21. A display module, comprising:
a display panel includes a first area and a second area adjacent to the first area, wherein the display panel further includes a base layer, a circuit layer disposed on the base layer, a first pixel electrode disposed on the circuit layer and disposed in the first area, and a pixel defining pattern disposed on the circuit layer and having a ring shape covering an edge of the first pixel electrode; and
an anti-reflection layer disposed on the display panel and including a first color filter overlapping the first pixel electrode,
wherein the pixel defining pattern comprises a first edge overlapping the first pixel electrode and a second edge surrounding the first edge, and
wherein a distance between an edge of the first color filter and the first edge is longer than a distance between the edge of the first color filter and the second edge.

22. The display module of claim 21, wherein the anti-reflection layer further comprises a division pattern overlapping the first area,
wherein the division pattern has a ring shape including a first division edge and a second division edge surrounding the first division edge,
wherein the first color filter covers an area surrounded by the first division edge, and
wherein a distance between the first edge and the second edge is longer than a distance between the first division edge and the second division edge.

23. The display module of claim 21, wherein
the display panel further comprises a second pixel electrode disposed on the circuit layer and disposed in the second area, and a pixel defining film disposed on the circuit layer and covering the second pixel electrode, the pixel defining film including an opening exposing a portion of the second pixel electrode, and
the anti-reflection layer further comprises a second color filter overlapping the second pixel electrode and a dummy color filter overlapping the second area.

24. A display module, comprising:
a base layer;
a circuit layer disposed on the base layer and includes a pixel circuit and a connection line connected to the pixel circuit and including a light-transmissive material;
a pixel electrode disposed on the circuit layer and electrically connected to the connection line; and
a pixel defining pattern disposed on the circuit layer, covering an edge of the pixel electrode, and including a first edge overlapping the pixel electrode and a second edge surrounding the first edge,
wherein the edge of the pixel electrode is curved and the first and second edges of the pixel defining pattern are curved.

* * * * *